United States Patent
Uehara et al.

[19]

[11] Patent Number: 6,034,416
[45] Date of Patent: Mar. 7, 2000

[54] SEMICONDUCTOR DEVICE AND METHOD FOR FABRICATING THE SAME

[75] Inventors: Takashi Uehara; Toshiki Yabu; Mizuki Segawa; Takaaki Ukeda, all of Osaka; Masatoshi Arai, Nara; Masaru Moriwaki, Osaka, all of Japan

[73] Assignee: Matsushita Electirc Industrial Co., Ltd., Osaka, Japan

[21] Appl. No.: 09/061,071

[22] Filed: Apr. 16, 1998

[30] Foreign Application Priority Data

Apr. 17, 1997 [JP] Japan .................................. 9-100380

[51] Int. Cl.⁷ ..................................................... H01L 29/72
[52] U.S. Cl. ........................... 257/623; 257/296; 257/314; 257/401; 438/225; 438/697; 438/700
[58] Field of Search ..................................... 257/296, 314, 257/401, 623; 438/211, 225, 257, 694, 697, 700

[56] References Cited

U.S. PATENT DOCUMENTS 5,714,793  2/1998  Cartagena et al. ....................... 257/623

FOREIGN PATENT DOCUMENTS 02021657  1/1990  Japan .
02163964  6/1990  Japan .
03295276  12/1991  Japan .

*Primary Examiner*—Edward Wojciechowicz
*Attorney, Agent, or Firm*—McDermott, Will & Emery

[57] ABSTRACT

The top surface of a substrate in a peripheral circuit region is at a level that is higher than the top surface of the substrate in a memory cell region and that is substantially equal to the top surface of a floating gate electrode. A control gate electrode is formed on the floating gate electrode via a gate insulator film, and a gate electrode is formed on the substrate in the peripheral circuit region via a gate insulator film. The top surface of a buried insulator film for trench isolation may be at a level equal to the top surface of the floating gate electrode or to the top surface of an underlying film if the control gate electrode is formed of a multi-layer film. A level difference between the control gate electrode in the memory cell region and the gate electrode in the peripheral circuit region can be reduced, and thus fine patterns can be formed in these regions. In a flash-integrated logic LSI incorporating a nonvolatile memory cell, a density can be increased in the memory cell region and the peripheral circuit region and the costs can be reduced.

48 Claims, 17 Drawing Sheets

MEMORY CELL REGION Rmemo | PERIPHERAL CIRCUIT REGION Rperi

MEMORY CELL REGION Rmemo | PERIPHERAL CIRCUIT REGION Rperi

MEMORY CELL REGION Rmemo | PERIPHERAL CIRCUIT REGION Rperi

MEMORY CELL REGION Rmemo | PERIPHERAL CIRCUIT REGION Rperi

SEMICONDUCTOR DEVICE AND METHOD FOR FABRICATING THE SAME

BACKGROUND OF THE INVENTION

The present invention relates to a semiconductor device incorporating a nonvolatile memory cell having a floating gate electrode and a control gate electrode and a method for fabricating the same.

In recent years, as the prices of various system units have been reduced and products have been replaced in shorter and shorter cycles, it is increasingly necessary to further reduce the costs and further shorten the development cycle of semiconductor devices. In particular, a semiconductor device (flash-integrated logic LSI), equipped with flash memory and an cutting-edge logic circuit, not only can reduce the costs thanks to the single-chip implementation thereof, but also is expected as a strong candidate device for further shortening the development cycle.

In order to implement dissimilar devices such as flash memories and DRAM/logic circuits on a single chip, the element density should be increased, which in turn requires a fine processing dimension. Important factors in further reducing a processing dimension are the accuracy of a pattern to be formed with respect to a mask pattern and the flatness of a substrate during the formation of a pattern by lithography.

In the improvement of the processing accuracy, technology for forming an element isolation for isolating respective elements plays an important role. Although the element isolation has been formed by a local oxidation of silicon (LOCOS) method, this method has a problem in that phenomenon so-called bird's beak causes a pattern shift, that is, the accuracy of the pattern to be formed with respect to the mask pattern is deteriorated. Thus, in this method, a maximum possible element density has substantially been reached. For this reason, in a memory cell region, the LOCOS method has recently been replaced by a trench isolation method causing no bird's beak phenomenon. Such a flash memory using the trench isolation is disclosed, for example, in Japanese Laid-open Publication No. 3-295276.

FIG. 17 is a cross-sectional view of the semiconductor device disclosed in the above-identified publication. As shown in FIG. 17, a P-type silicon substrate 201 includes a memory cell region Rmemo and a peripheral circuit region Rperi. In FIG. 17, the memory cell region Rmemo is shown as a cross section perpendicular to the gate longitudinal direction, and the peripheral circuit region Rperi is shown as a cross section parallel to the gate longitudinal direction. In the memory cell region Rmemo, a nonvolatile memory cell, including a tunnel oxide film 213a, a floating gate electrode 214, a gate insulator film 215, a control gate electrode 216a, a silicide layer 220a and an impurity layer (not shown) to be source/drain regions, is disposed in an active region surrounded by trench isolations 218. On the other hand, in the peripheral circuit region Rperi, a field effect transistor, including a gate oxide film 213b, a gate electrode 216b, a silicide layer 220b, and an impurity layer 223 to be source/drain regions, is disposed in an active region surrounded by the LOCOS film 212. Furthermore, an interlevel insulator film 222 is deposited on the substrate, and a bit line 224 is formed thereon. This conventional semiconductor device can be formed by the following procedure.

First, the LOCOS film 212 is formed in the peripheral circuit region Rperi, and then the tunnel oxide film 213a and the gate oxide film 213b are formed in the memory cell region Rmemo and the peripheral circuit region Rperi, respectively. Then, the floating gate electrode 214 and the gate oxide film 215 are selectively formed in the memory cell region Rmemo.

Thereafter, a gate electrode film is deposited over the entire surface of the substrate and patterned by lithography and etching, so as to form the control gate electrode 216a in the memory cell region Rmemo and the gate electrode 216b in the peripheral circuit region Rperi, respectively.

Then, element-isolating trenches are formed so as to surround the active region in the memory cell region Rmemo by lithography and etching. An insulator film is deposited over the entire surface of the substrate and then leveled, thereby filling the trenches with the insulator film and forming the trench isolation 218.

Then, after the silicide layers 220a and 220b have been formed on the control gate electrode 216a and the gate electrode 216b, respectively, the interlevel insulator film 222 is deposited on the substrate and the bit line 224 is formed thereon.

By forming the trench isolation 218 in the memory cell region Rmemo in this manner, the accuracy of the pattern to be formed with respect to the mask pattern can be improved and the density of the memory cell region can be increased. Furthermore, the cell area can be reduced by forming the trench isolation 218 to be self-aligned with the floating gate electrode 213a.

Also, a process step of forming the floating gate electrode of the nonvolatile memory cell and the control gate electrode of the field effect transistor of a common conductor film is also employed.

However, this conventional technique has the following problems.

Although the technique can increase the element density of the memory cell region, not only the area of the memory cell region but also the area of the peripheral circuit region need to be reduced in order to increase the density of the entire semiconductor device. The element isolation in the peripheral circuit region may be formed by the trench isolation method instead of the conventional LOCOS method. However, the conventional technique fails to keep the flatness of the entire substrate. More specifically, if the trench isolation structures are to be formed simultaneously in the memory cell region Rmemo and the peripheral circuit region Rperi, then the presence of the floating gate electrode 214 in the memory cell region Rmemo causes a level difference between the control gate electrode 216a in the memory cell region Rmemo and the gate electrode 216b in the peripheral circuit region Rperi, which deteriorates the flatness of the entire substrate.

In short, since it is difficult to simultaneously maintain sufficient accuracy of a pattern to be formed with respect to a mask pattern and sufficient flatness of the substrate, the single-chip implementation of a flash-integrated logic LSI has been hard to realize.

SUMMARY OF THE INVENTION

In view of the above-mentioned conventional problems, the present invention has been devised for the purpose of providing a semiconductor device, which can increase the element density of both a memory cell region and a peripheral circuit region and maintain a sufficient flatness for a semiconductor substrate in accordance with a simple method, and providing a method for fabricating the same.

In order to accomplish the above-mentioned objective, in the semiconductor device and a method for fabricating the same of the present invention, the top surface of a semiconductor substrate in an active region in the peripheral circuit region is formed at a level that is higher than the top surface of the semiconductor substrate in the memory cell region and that is substantially equal to the top surface of the floating gate.

The semiconductor device of the present invention includes: a semiconductor substrate including a memory cell region and a peripheral circuit region; trench isolations formed so as to respectively surround a first active region in the memory cell region and a second active region in the peripheral circuit region of the semiconductor substrate; a nonvolatile memory cell disposed in the memory cell region and formed by sequentially stacking a tunnel insulator film, a floating gate electrode, a gate insulator film and a control gate electrode at least in the first active region on the semiconductor substrate; and a field effect transistor disposed in the peripheral circuit region and formed by sequentially stacking a gate insulator film and a gate electrode at least in the second active region on the semiconductor substrate. A top surface of the semiconductor substrate in the second active region is at a level that is higher than a top surface of the semiconductor substrate in the first active region and that is substantially equal to a top surface of the floating gate electrode.

Thus, since the top surface of the floating gate electrode is at a level equal to the top surface of the semiconductor substrate in the second active region in the peripheral circuit region, the level difference between the control gate electrode and the gate electrode is reduced and a sufficient flatness can be ensured for the entire semiconductor device. Furthermore, since a so-called trench isolation structure is provided not only in the memory cell region but also in the peripheral circuit region, the accuracy of a pattern to be formed with respect to a mask pattern can be improved. As a result, the elements can be formed at a high density throughout the semiconductor device.

In the semiconductor device, a top surface of the trench isolations may be at a level substantially equal to the top surface of the semiconductor substrate in the second active region in the peripheral circuit region and the top surface of the floating gate electrode.

Consequently, the trench isolation structure can be formed while leveling the top surface of the semiconductor device in the second active region in the peripheral circuit region with the top surface of the floating gate electrode in the memory cell region. As a result, the flatness of the entire semiconductor device can be improved.

In the semiconductor device, the floating gate electrode of the nonvolatile memory cell is preferably disposed between the trench isolations and self-aligned with the trench isolations in a vertical cross section perpendicular to a gate longitudinal direction.

Consequently, since the element isolation and the floating gate electrode can be formed without using separate mask patterns, the margin for mask alignment is no longer necessary, which further increases the density of the memory cell region.

In the semiconductor device, the control gate electrode of the nonvolatile memory cell may be formed so as to be mounted over the floating gate electrode and the semiconductor substrate.

Consequently, the above-mentioned effects can be attained in a split-gate type memory cell having good data retention characteristics.

In the semiconductor device, each of the control gate electrode and the gate electrode is preferably formed of one of the group consisting of: a polycrystalline silicon film; an amorphous silicon film; a metallic film; a multi-layer film of a polycrystalline silicon film and a metallic film; a multi-layer film of a polycrystalline silicon film and a metallic compound film; a multi-layer film of an amorphous silicon film and a metallic film; a multi-layer film of an amorphous silicon film and a metallic compound film; a multi-layer film of metallic films; a multi-layer film of metallic films and a polycrystalline silicon film; and a multi-layer film of metallic films and an amorphous silicon film.

In the semiconductor device, the control gate electrode of the nonvolatile memory cell and the gate electrode of the field effect transistor may be formed of a common overlying conductor film and a common underlying conductor film, the underlying conductor film in the second active region in the peripheral circuit region may be disposed between the trench isolations and self-aligned with the trench isolations in a vertical cross section perpendicular to a gate longitudinal direction of the field effect transistor, and a top surface of the trench isolations may be at a level substantially equal to a top surface of the underlying conductor film.

Consequently, the underlying conductor film formed on the floating gate electrode in the memory cell region via the gate insulator film is leveled with the element isolation formed on the top surface of the semiconductor substrate in the second active region in the peripheral circuit region via the gate insulator film. In addition, since the floating gate electrode is disposed between the trench isolations, the above-mentioned effects can be attained. Moreover, since the underlying conductor film which constitutes the gate electrode in the second active region in the peripheral circuit region is self-aligned with the trench isolations, it is possible to suppress the variations in characteristics resulting from the high electric field on the side surfaces of the trenches, which have adversely been caused in conventional trench isolations.

In the semiconductor device, the gate electrode of the field effect transistor may be formed of an overlying conductor film and an underlying conductor film, the control gate electrode of the nonvolatile memory cell may be formed of the overlying conductor film only and formed so as to be mounted over the floating gate electrode and the semiconductor substrate, and the underlying conductor film in the second active region in the peripheral circuit region may be disposed between the trench isolations and self-aligned with the trench isolations in a vertical cross section perpendicular to a gate longitudinal direction of the field effect transistor.

Consequently, it is possible to increase the density of a semiconductor device including a nonvolatile memory cell having a split-gate structure with good data retention characteristics, while attaining the above-mentioned effects.

In the semiconductor device, the underlying conductor film is preferably selected from the group consisting of: a polycrystalline silicon film; an amorphous silicon film; a metallic film; a multi-layer film of a polycrystalline silicon film and a metallic film; a multi-layer film of a polycrystalline silicon film and a metallic compound film; a multi-layer film of an amorphous silicon film and a metallic film; a multi-layer film of an amorphous silicon film and a metallic compound film; a multi-layer film of metallic films; a multi-layer film of metallic films and a polycrystalline silicon film; and a multi-layer film of metallic films and an amorphous silicon film.

In the semiconductor device, the gate insulator film of the nonvolatile memory cell may have a thickness larger than a thickness of the gate insulator film of the field effect transistor.

Consequently, it is possible to secure an appropriate thickness for each of these gate insulator films.

In the semiconductor device, a region in the vicinity of a surface of the semiconductor substrate in the peripheral circuit region may be formed of a semiconductor crystalline film formed by epitaxy.

Consequently, it is possible to form a semiconductor device incorporating a high-density flash memory by utilizing an epitaxially grown film having good semiconductor crystalline characteristics.

The first method for fabricating a semiconductor device of the present invention is a method for forming a semiconductor device including: a nonvolatile memory cell including a tunnel insulator film, a floating gate electrode, a gate insulator film and a control gate electrode on a first active region in a memory cell region of a semiconductor substrate; and a field effect transistor including a gate insulator film and a gate electrode on a second active region in a peripheral circuit region of the semiconductor substrate. The method includes: a first step of forming a level difference between a top surface of the semiconductor substrate in the memory cell region and a top surface of the semiconductor substrate in the peripheral circuit region such that the top surface of the semiconductor substrate in the memory cell region is at a level lower than the top surface of the semiconductor substrate in the peripheral circuit region; a second step of sequentially forming the tunnel insulator film and a first conductor film on the top surface of the semiconductor substrate in the memory cell region and substantially leveling a top surface of the first conductor film with the top surface of the semiconductor substrate in the peripheral circuit region; a third step of forming element-isolating trenches surrounding the first active region in the memory cell region and the second active region in the peripheral circuit region in the semiconductor substrate; and a fourth step of forming trench isolations by filling the trenches with the insulator film.

According to this method, a trench isolation structure can be formed in the third and the fourth steps after the top surface of the first conductor film in the memory cell region has been leveled with the top surface of the semiconductor substrate in the peripheral circuit region in the second step. Consequently, it is possible to form a semiconductor device having a sufficiently flat surface and including elements at a high density.

The first method for fabricating the semiconductor device, may further include, after the fourth step has been performed, the steps of: sequentially forming an insulator film for the gate insulator film, a second conductor film and a conductor-protecting film on the semiconductor substrate; selectively removing the conductor-protecting film and the second conductor film by performing etching with a mask member covering a control gate electrode formation region and a gate electrode formation region, and forming the control gate electrode and an electrode protective film in the first active region and the gate electrode in the second active region, respectively; and removing the mask member and then selectively removing the insulator film for the gate insulator film and the first conductor film by performing etching by using, as an etching mask, a mask member covering the peripheral circuit region and the electrode protective film, thereby forming the floating gate electrode in the first active region.

According to this method, the gate insulator film in the memory cell region and the gate insulator film in the peripheral circuit region may be formed of the same member, and the floating gate electrode in the memory cell region and the gate electrode in the peripheral circuit region may also be formed of the same member. Consequently, it is possible to form a semiconductor device having a high density easily with lower costs. Furthermore, the floating gate electrode can be formed by etching with the control gate electrode as a mask. Thus, a margin for mask alignment is no longer necessary, thereby increasing the density in the memory cell region.

The first method for fabricating the semiconductor device may further include, after the fourth step has been performed, the steps of: sequentially forming an insulator film for the gate insulator film and a second conductor film on the semiconductor substrate; selectively removing the second conductor film by performing etching with a mask member covering the memory cell region and a gate electrode formation region, and forming the gate electrode in the second active region; and removing the mask member and selectively removing the second conductor film, the insulator film for the gate insulator film and the first conductor film sequentially by performing etching by using a mask member covering the peripheral circuit region and a control gate electrode formation region, thereby forming the control gate electrode and the floating gate electrode in the first active region.

According to this method, the gate insulator film in the memory cell region and the gate insulator film in the peripheral circuit region may be formed of the same member, and the floating gate electrode in the memory cell region and the gate electrode in the peripheral circuit region may also be formed of the same member. Consequently, it is possible to form a semiconductor device having a high density easily with lower costs. Furthermore, the floating gate electrode and the control gate electrode can be formed by etching using the same mask member. Thus, a margin for mask alignment is no longer necessary, thereby increasing the density in the memory cell region.

The first method for fabricating the semiconductor device may further include, after the fourth step has been performed, the steps of: selectively removing the first conductor film by performing etching with a mask member covering the peripheral circuit region and a floating gate electrode formation region, and forming the floating gate electrode in the first active region; removing the mask member and then sequentially forming an insulator film for the gate insulator film and a second conductor film on the semiconductor substrate; and selectively removing the first conductor film, the insulator film for the gate insulator film, and the second conductor film by performing etching by using a mask member covering a control gate electrode formation region and a gate electrode formation region, thereby forming the control gate electrode mounted over the floating gate electrode and the semiconductor substrate in the first active region and the gate electrode in the second active region, respectively.

According to this method, it is possible to form a semiconductor device including a split-gate type nonvolatile memory cell at a high density.

In the first method for fabricating the semiconductor device, the insulator film for the gate insulator film may be formed so as to have a larger thickness in the memory cell region than in the peripheral circuit region.

According to this method, it is possible to form a semiconductor device where a gate insulator film functioning as a capacitive insulator film between the floating gate electrode and the control gate electrode in the nonvolatile memory cell and a gate insulator film of the field effect transistor have different and appropriate thicknesses.

In the first method for fabricating the semiconductor device, the first step may include the steps of: sequentially forming a silicon oxide film and a silicon nitride film on the semiconductor substrate; selectively removing the silicon nitride film in the memory cell region; performing thermal oxidation by using the silicon nitride film as a mask and forming a LOCOS film on the semiconductor substrate in the memory cell region; and removing the silicon nitride film and the LOCOS film.

According to this method, when the silicon oxide film is removed, the top surface of the semiconductor substrate in the memory cell region is lower than the top surface of the semiconductor substrate in the second region in the peripheral circuit region. Thus, a level difference can be easily formed between these top surfaces. Also, since the ends of the thermally oxidized film have a wedge shape, only steps having relatively gentle slopes are formed. Consequently, in subsequent process steps, it is possible to prevent defects from being generated owing to an etching residue.

In the first method for fabricating the semiconductor device, the first step may include the step of partially removing the semiconductor substrate in the memory cell region to reach a predetermined depth by performing etching with a mask member having an opening over the memory cell region.

In the first method for fabricating the semiconductor device, the first step may include the steps of: forming an insulator film on the semiconductor substrate; selectively removing a part the insulator film, the part covering the peripheral circuit region; epitaxially growing a semiconductor crystalline film on a surface of the semiconductor substrate which is exposed in the peripheral circuit region by using a remaining part of the insulator film as an epitaxy mask; and removing the remaining part of the insulator film.

According to these methods, a level difference can be easily formed between the top surface of the semiconductor substrate in the memory cell region and the top surface of the semiconductor substrate in the peripheral circuit region.

In the first method for fabricating the semiconductor device, the second step may include the steps of: sequentially forming the tunnel insulator film and the first conductor film on the semiconductor substrate; removing the first conductor film by CMP until at least a part of the tunnel insulator film in the peripheral circuit region is exposed; and removing the part of the tunnel insulator film in the peripheral circuit region by etching.

In the first method for fabricating the semiconductor device, the second step may include the steps of: sequentially forming the tunnel insulator film and the first conductor film on the semiconductor substrate; and selectively removing the first conductor film and the tunnel insulator film in the peripheral circuit region sequentially by performing etching with a mask member covering the memory cell region.

In the first method for fabricating the semiconductor device, the second step may include the steps of: sequentially forming the tunnel insulator film and the first conductor film on the semiconductor substrate; selectively removing the first conductor film and the tunnel insulator film sequentially by performing etching with a mask member covering at least the memory cell region and a region of the peripheral circuit region, the region being in the vicinity of a boundary between the memory cell region and the peripheral circuit region; removing the mask member and removing a residual part of the first conductor film by CMP, the residual part protruding in the vicinity of the boundary between the memory cell region and the peripheral circuit region; and removing the tunnel insulator film in the peripheral circuit region by etching.

The second method for fabricating a semiconductor device of the present invention is a method for forming a semiconductor device including: a nonvolatile memory cell including a tunnel insulator film, a floating gate electrode, a gate insulator film and a control gate electrode on a first active region in a memory cell region of a semiconductor substrate; and a field effect transistor including a gate insulator film and a gate electrode on a second active region in a peripheral circuit region of the semiconductor substrate. The method includes: a first step of forming the tunnel insulator film, a first conductor film on the tunnel insulator film, and a conductor-protecting film on the first conductor film in the memory cell region with the semiconductor substrate in the peripheral circuit region exposed; a second step of growing semiconductor crystals on the semiconductor substrate in the peripheral circuit region, thereby forming a semiconductor crystalline film having a top surface at a level substantially equal to a top surface of the first conductor film in the memory cell region; a third step of removing the first conductor-protecting film on the first conductor film; a fourth step of forming element-isolating trenches surrounding the first active region in the memory cell region and the second active region in the peripheral circuit region; and a fifth step of forming trench isolations by filling the trenches with the insulator film.

According to this method, at a point in time when the first process step is completed, a level difference has already been formed between the top surface of the semiconductor substrate in the memory cell region and the top surface of the semiconductor substrate in the peripheral circuit region. The top surface of the first conductor film, constituting the floating gate in the memory cell region, has been leveled with the top surface of the semiconductor substrate in the peripheral circuit region. Consequently, a semiconductor device having a sufficient flatness and a high density can be formed as in the first method for fabricating the semiconductor device.

In the second method for fabricating the semiconductor device, the first step can be easily carried out by performing the following process steps.

In the second method for fabricating the semiconductor device, the first step may include the steps of: sequentially forming the tunnel insulator film, the first conductor film, and the conductor-protecting film on the semiconductor substrate; and sequentially removing the conductor-protecting film, the first conductor film, and the tunnel insulator film in the peripheral circuit region by performing etching with a mask member covering the memory cell region.

In the second method for fabricating the semiconductor device, the first step may include the steps of: sequentially forming the tunnel insulator film and the first conductor film on the semiconductor substrate; removing the first conductor film and the tunnel insulator film in the peripheral circuit region by performing etching with a mask member covering the memory cell region; removing the mask member and then forming the first conductor-protecting film on the first conductor film in the memory cell region and on the semiconductor substrate in the peripheral circuit region so as to have a larger thickness on the first conductor film than on the semiconductor substrate; and removing the first conductor-protecting film in the peripheral circuit region by an etch-back technique under such a condition that the first conductor-protecting film on the first conductor film is residual in the memory cell region.

In the second method for fabricating the semiconductor device, the first step may include the steps of: sequentially forming the tunnel insulator film, the first conductor film, and the first conductor-protecting film on the semiconductor substrate; removing the first conductor-protecting film, the first conductor film, and the tunnel insulator film in the peripheral circuit region by performing etching with a mask member covering the memory cell region; removing the mask member and then forming a second conductor-protecting film on the semiconductor substrate; and selectively removing the second conductor-protecting film by an etch-back technique such that the second conductor-protecting film is residual on a side surface of the first conductor film and that the first conductor-protecting film is residual on the first conductor film.

In the second method for fabricating the semiconductor device, the same process steps as those added to the first method for fabricating the semiconductor device may be additionally performed after the fifth process step has been performed.

The third method for fabricating a semiconductor device of the present invention is a method for forming a semiconductor device including: a nonvolatile memory cell including a tunnel insulator film, a floating gate electrode, a gate insulator film and a control gate electrode at least on a first active region in a memory cell region of a semiconductor substrate; and a field effect transistor including a gate insulator film and a gate electrode at least on a second active region in a peripheral circuit region of the semiconductor substrate. The method includes: a first step of forming a level difference between a top surface of the semiconductor substrate in the memory cell region and a top surface of the semiconductor substrate in the peripheral circuit region such that the top surface of the semiconductor substrate in the memory cell region is at a level lower than the top surface of the semiconductor substrate in the peripheral circuit region; a second step of sequentially forming the tunnel insulator film and a first conductor film on the top surface of the semiconductor substrate in the memory cell region and substantially leveling a top surface of the first conductor film with the top surface of the semiconductor substrate in the peripheral circuit region; a third step of forming element-isolating trenches surrounding the first active region in the memory cell region and the second active region in the peripheral circuit region in the semiconductor substrate; a fourth step of forming an insulator film for the gate insulator film and a second conductor film on the semiconductor substrate; and a fifth step of forming trench isolations by filling the trenches with the insulator film.

According to this method, it is possible to form a semiconductor device, in which a field effect transistor having a gate electrode consisting of two conductor films is disposed in the peripheral circuit region and which can attain the above-mentioned effects.

The fourth method for fabricating a semiconductor device of the present invention is a method for forming a semiconductor device including: a nonvolatile memory cell including a tunnel insulator film, a floating gate electrode, a gate insulator film and a control gate electrode on a first active region in a memory cell region of a semiconductor substrate; and a field effect transistor including a gate insulator film and a gate electrode on a second active region in a peripheral circuit region of the semiconductor substrate. The method includes: a first step of forming the tunnel insulator film, a first conductor film on the tunnel insulator film, and a conductor-protecting film on the first conductor film in the memory cell region with the semiconductor substrate in the peripheral circuit region exposed; a second step of growing semiconductor crystals on the semiconductor substrate in the peripheral circuit region, thereby forming a semiconductor crystalline film having a top surface at a level substantially equal to a top surface of the first conductor film in the memory cell region; a third step of removing the first conductor-protecting film on the first conductor film; a fourth step of forming an insulator film for the gate insulator film and a second conductor film; a fifth step of forming element-isolating trenches surrounding the first active region in the memory cell region and the second active region in the peripheral circuit region; and a sixth step of forming trench isolations by filling the trenches with the insulator film.

According to this method, it is possible to form a semiconductor device, which has a semiconductor substrate including a peripheral circuit formed by epitaxy and in which a field effect transistor having a gate electrode consisting of two conductor films is disposed in the peripheral circuit region.

DETAILED DESCRIPTION OF THE INVENTION

EMBODIMENT 1

A semiconductor device and a method for fabricating the semiconductor device in accordance with the first embodiment will be described with reference to FIGS. 1, FIGS. 2a to 2f and FIGS. 3a to 3e.

Figure 1:
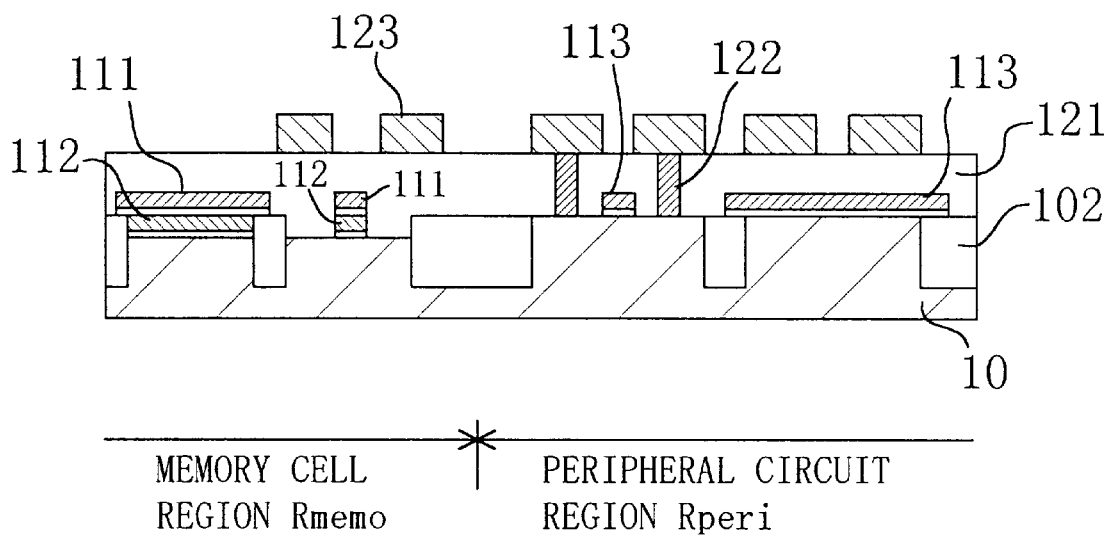
FIG. 1 is a cross-sectional view showing a structure of a semiconductor device in the first and the second embodiments.

FIG. 1 is a cross-sectional view of the semiconductor device of the first embodiment. The semiconductor device includes: a semiconductor substrate 10; a control gate electrode 111 in a memory cell region Rmemo; a floating gate electrode 112; a gate electrode 113 in a peripheral circuit region Rperi; a buried insulator film 102 for element isolation; an interlevel insulator film 121; a contact hole 122; and a metal interconnection 123.

Figure 9:
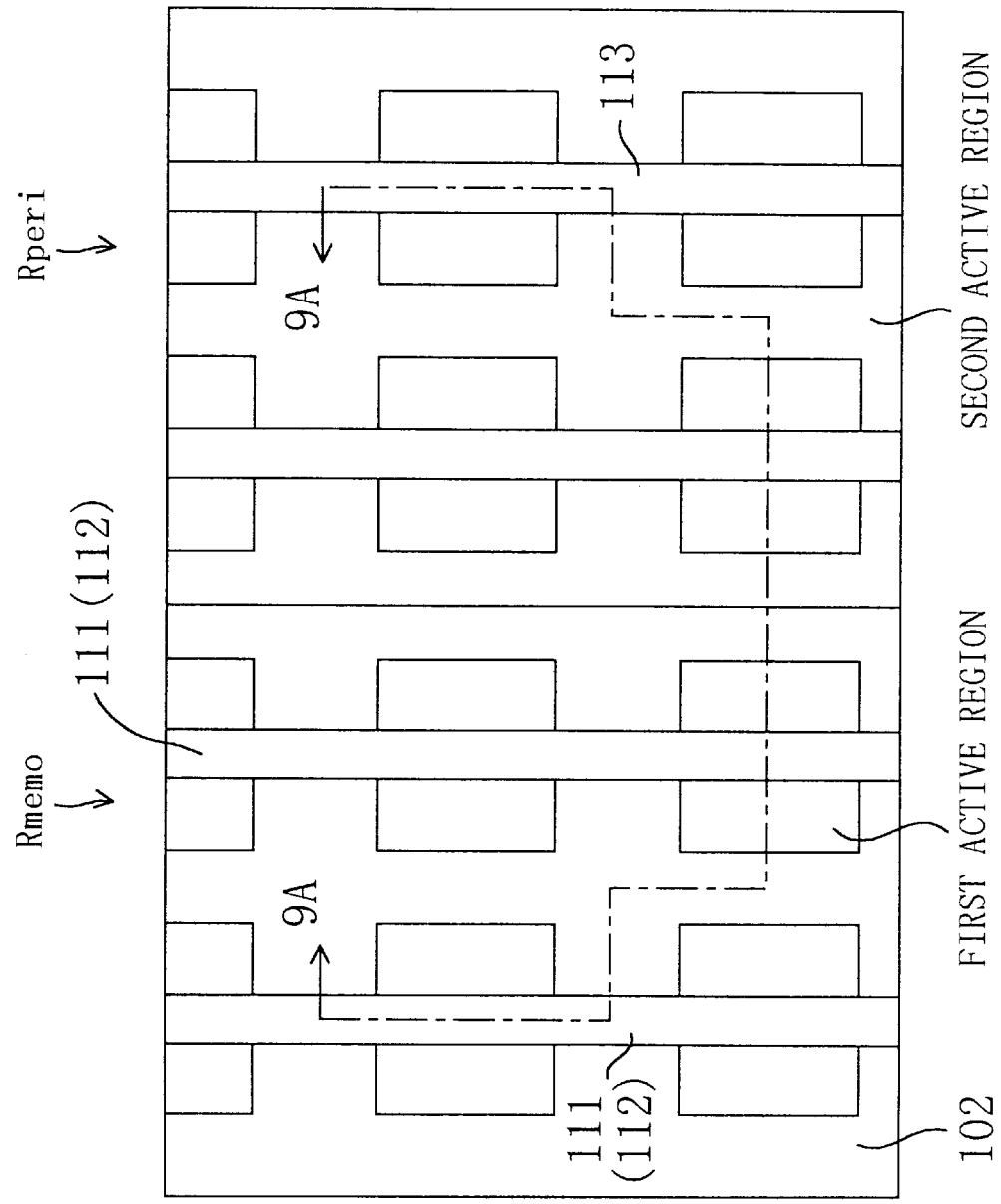
FIG. 9 is a plan view of the semiconductor device of the present invention.

FIGS. 2a to 2f and FIGS. 3a to 3e are cross-sectional views showing the process steps for fabricating the semiconductor device in the first embodiment. These cross-sectional views are all taken along the line 9A—9A shown in FIG. 9. More specifically, these cross-sectional views show a memory cell in the memory cell region Rmemo in the directions parallel to the gate longitudinal direction and show a MOFET in the peripheral circuit region Rperi and perpendicular to the gate longitudinal direction.

Figure 2A:
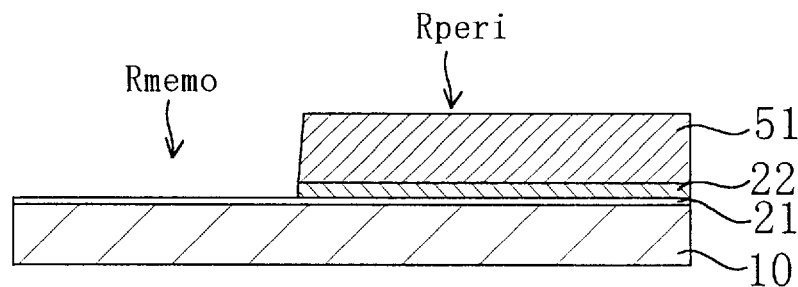
FIGS. 2a to 2f are cross-sectional views showing the respective process steps, performed until element-isolating trenches are formed, for fabricating a semiconductor device in the first embodiment.

In the process step shown in FIG. 2a, a pad oxide film 21 having a thickness of about 10 nm is formed by oxidizing the surface of the semiconductor substrate 10 and then a silicon nitride film 22 having a thickness of about 150 nm is deposited thereon. Then, a resist film 51 having an opening over the memory cell region Rmemo is further formed thereon, and etching is performed by using the resist film 51 as a mask, thereby removing the silicon nitride film 22 in the memory cell region.

Figure 2B:
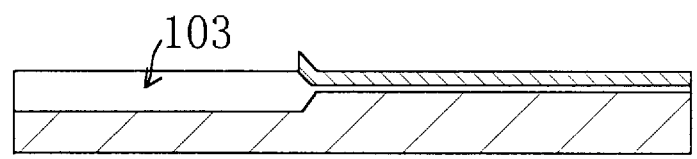

Next, in the process step shown in FIG. 2b, after the resist film 51 has been removed, the entire surface of the substrate is oxidized such that the pad oxide film 21, the surface of which is exposed in the memory cell region Rmemo, is thickened in the memory cell region Rmemo, thereby forming a field oxide film 103 having a thickness of about 200 nm.

Figure 2C:

Then, in the process step shown in FIG. 2c, the silicon nitride film 22, the pad oxide film 21 and the field oxide film 103, which have been formed on the semiconductor substrate 10, are all removed.

Figure 2D:
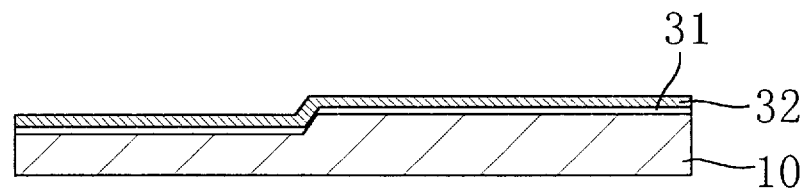

Subsequently, in the process step shown in FIG. 2d, a tunnel oxide film 31 having a thickness of about 10 nm is formed by oxidizing the entire surface of the semiconductor substrate 10, and then a polycrystalline silicon film 32 having a thickness of about 100 nm is deposited thereon as a first conductor film.

Figure 2E:

Thereafter, in the process step shown in FIG. 2e, a part of the polycrystalline silicon film 32 in the peripheral circuit region Rperi is removed by performing CMP (chemical and mechanical polishing) using the tunnel oxide film 31 as a stopper, thereby leveling the entire surface of the substrate. At this point in time, the polycrystalline silicon film 32 is exposed in the memory cell region Rmemo, while the tunnel oxide film 31 is exposed in the peripheral circuit region Rperi. Then, only the tunnel oxide film 31 exposed in the peripheral circuit region Rperi is removed by selective etching.

Figure 2F:
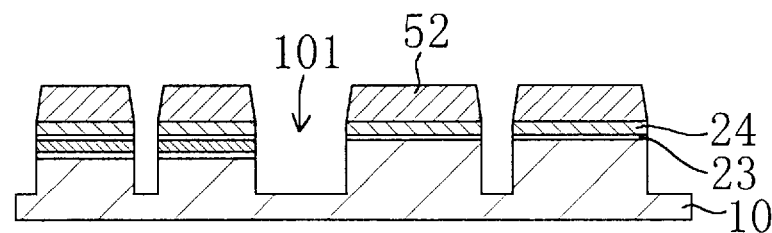

Next, in the process step shown in FIG. 2f, after a pad oxide film 23 and a silicon nitride film 24 have been formed in this order over the entire surface of the substrate, a resist film 52, having openings over the regions where the element isolations are provided, is formed thereon. Then, etching is performed by using the resist film 52 as a mask, thereby selectively removing the silicon nitride film 24, the pad oxide film 23, the polycrystalline silicon film 32, the tunnel oxide film 31 and a part of the semiconductor substrate 10 sequentially. Element-isolating trenches 101 are formed in this way.

Figure 3A:
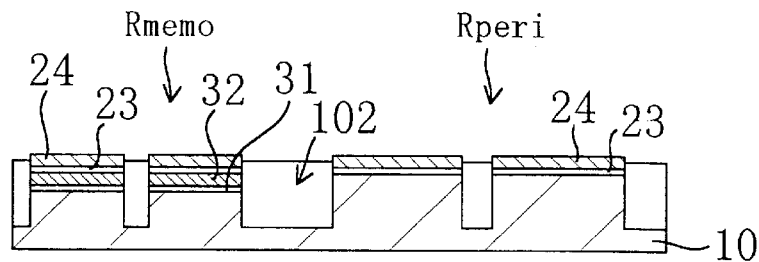
FIGS. 3a to 3e are cross-sectional views showing the process step of forming a buried insulator film and the subsequent process steps thereof for fabricating a semiconductor device in the first embodiment.

Next, in the process step shown in FIG. 3a, a buried insulator film 102 is formed in the element-isolating trenches 101 by depositing a silicon oxide film by a CVD method and leveling the entire surface by CMP.

Figure 3B:
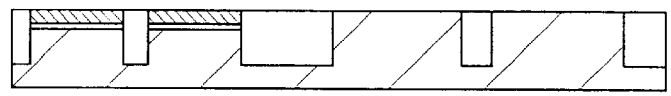

Subsequently, in the process step shown in FIG. 3b, the silicon nitride film 24 and the pad oxide film 23 are removed by selective etching (for example, wet etching), thereby substantially leveling the top surface of the substrate. At this point in time, the surface of the polycrystalline silicon film 32 is exposed in the memory cell region Rmemo, while the surface of the semiconductor substrate 10 is exposed in the peripheral circuit region Rperi.

Figure 3C:
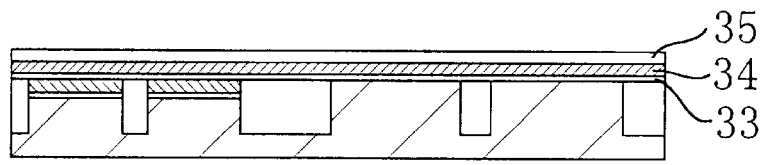

Then, in the process step shown in FIG. 3c, a gate oxide film 33 having a thickness of about 10 nm, a polycrystalline silicon film 34 having a thickness of about 150 nm as a second conductor film and a silicon oxide film 35 having a thickness of about 150 nm as a conductor-protecting film are formed in this order over the entire surface of the substrate.

Figure 3D:
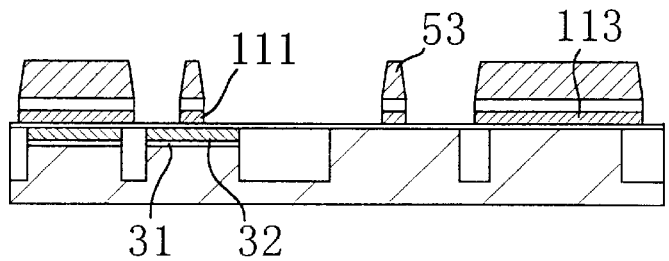

Thereafter, in the process step shown in FIG. 3d, a resist film 53, covering a region where a control gate electrode is to be formed in the memory cell region Rmemo and a region where a gate electrode is to be formed in the peripheral circuit region Rperi, is formed. Then, etching is performed by using the resist film 53 as a mask, thereby selectively removing the silicon oxide film 35 and the polycrystalline silicon film 34. As a result, a control gate electrode 111 and a gate electrode 113 are formed in the memory cell region Rmemo and in the peripheral circuit region Rperi, respectively. In each of these regions, the silicon oxide film 35, which has been patterned, functions as an electrode protective film.

Figure 3E:
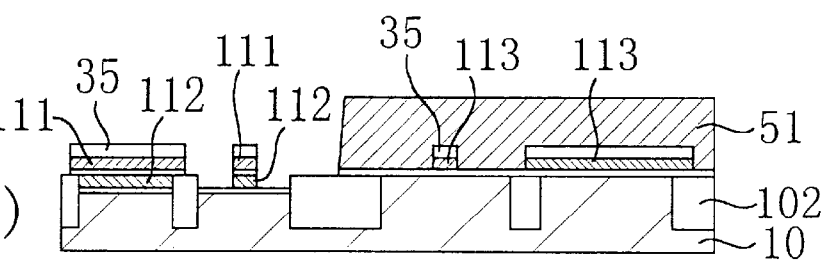

Subsequently, in the process step shown in FIG. 3e, after the resist film 53 has been removed, a resist film 51, having an opening over the memory cell region Rmemo, is formed and etching is performed by using the resist film 51 as a mask, thereby selectively removing the gate oxide film 33 and the polycrystalline silicon film 32 in the memory cell region Rmemo. As a result, a floating gate electrode 112 is formed in the memory cell region Rmemo.

The illustration of the subsequent process steps will be omitted herein. After the resist film 51 has been removed, an interlevel insulator film, contact holes and an interconnection layer are formed. As a result, a nonvolatile memory cell is formed in the memory cell region Rmemo, while a field effect transistor to be a driver circuit for the memory cell and a field effect transistor to be a logic circuit are formed in the peripheral circuit region Rperi.

According to this embodiment, in the process steps shown in FIGS. 2a to 2c, a level difference is formed between the top surface of the semiconductor substrate in the memory cell region and the top surface of the semiconductor substrate in the peripheral circuit region in view of the thickness of the floating gate electrode and that of the tunnel oxide film. Thus, subsequent process steps can be performed easily and accurately. As a result, the following effects can be attained.

In the memory cell region Rmemo of the semiconductor device fabricated in accordance with the foregoing fabrication process, the buried insulator film 102, constituting element isolations in a cross section perpendicular to the gate longitudinal direction, is formed to be self-aligned with the floating gate electrode 112, while the floating gate electrode 112 is formed to be self-aligned with the control gate electrode 111. Thus, in such a structure, no margin is required for mask alignment for forming each member, thereby further increasing the density in the memory cell region Rmemo.

In addition, since the top surface of the substrate is leveled in the process step (shown in FIG. 2e) immediately prior to the step of forming the trench isolations, a photolithography process can be performed accurately and easily to form the resist film 52 for element isolation. Moreover, the element-isolating trenches 101 can be filled with the insulator film and subsequent leveling can be performed easily without any restriction. Consequently, fine trench isolations can be formed both in the memory cell region Rmemo and in the peripheral circuit region Rperi by performing a simple process of forming trench isolations only once. Furthermore, since element isolation is accomplished not by a LOCOS film but by the trench isolations, the density of the entire semiconductor device can be increased.

Also, in the fabrication process of this embodiment, in the process step (see FIG. 3d) of forming the control gate electrode 111 and the gate electrode 113, the memory cell region Rmemo and the peripheral circuit region Rperi are at a substantially equal level. Thus, a photolithography process for forming the resist film 53 for a gate electrode can be performed accurately and easily. Moreover, since the top surface of the control gate electrode 111 in the memory cell region Rmemo is leveled with the top surface of the gate electrode 113 in the peripheral circuit region Rperi, a metal interconnection pattern can be easily formed subsequently.

Consequently, single-chip implementation of dissimilar devices such as flash memory and DRAM/logic is realized with practicable fabrication costs.

EMBODIMENT 2

Next, the second embodiment will be described with reference to FIGS. 4a to 4e. The semiconductor device of this embodiment has the same structure as that of the first embodiment. FIGS. 4a to 4e are cross-sectional views showing the fabrication process of the semiconductor device in the second embodiment. These cross-sectional views are all taken along the line 9A—9A shown in FIG. 9.

In this embodiment, the process steps shown in FIGS. 2a to 2f are also performed as in the first embodiment. The description of these process steps will be omitted herein.

Figure 4A:
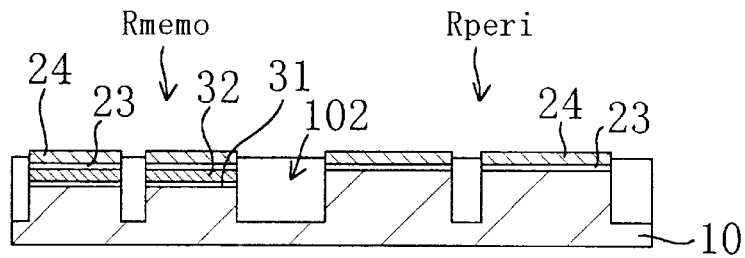
FIGS. 4a to 4e are cross-sectional views showing the process step of forming a buried insulator film and the subsequent process steps thereof for fabricating a semiconductor device in the second embodiment.

Subsequently to the process step shown in FIG. 2f, in the process step shown in FIG. 4a, a buried insulator film 102 is formed in trenches by depositing a silicon oxide film by the CVD method and leveling by CMP.

Figure 4B:
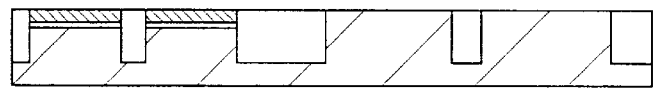

Then, in the process step shown in FIG. 4b, the silicon nitride film 24 and the pad oxide film 23 are removed. At this point in time, the surface of the polycrystalline silicon film 32 is exposed in the memory cell region Rmemo, while the surface of the semiconductor substrate 10 is exposed in the peripheral circuit region Rperi.

Figure 4C:
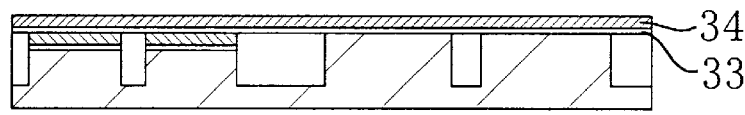

Subsequently, in the process step shown in FIG. 4c, a gate oxide film 33 having a thickness of about 10 nm and a polycrystalline silicon film 34 having a thickness of about 150 nm as a second conductor film are formed in this order over the entire surface of the substrate.

Figure 4D:
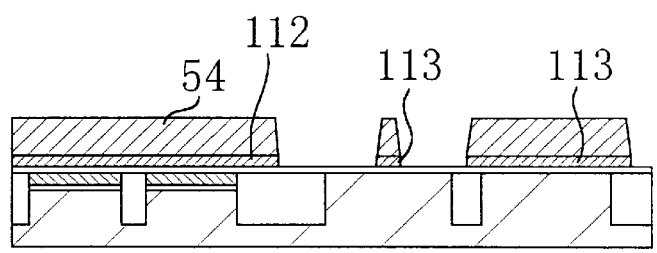

Thereafter, in the process step shown in FIG. 4d, a resist film 54, covering the entire memory cell region Rmemo and a region where a gate electrode is to be formed in the peripheral circuit region Rperi, is formed. Then, etching is performed by using the resist film 54 as a mask, thereby selectively removing the polycrystalline silicon film 34. The gate electrode 113 is formed in the peripheral circuit region Rperi in this manner.

Figure 4E:
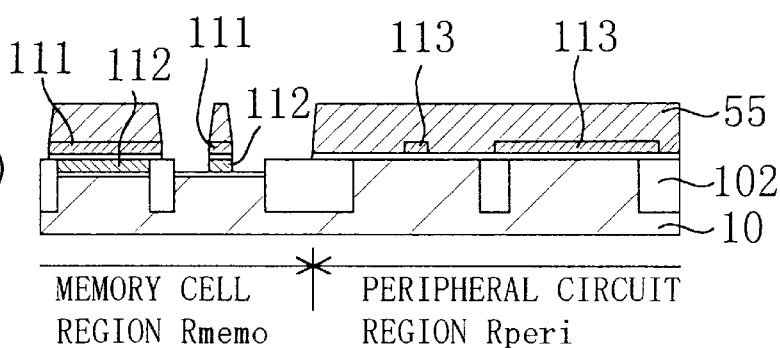

Next, in the process step shown in FIG. 4e, after the resist film 54 has been removed, a resist film 55, covering the entire peripheral circuit region Rperi and a region where the control gate electrode is to be formed in the memory cell region Rmemo, is formed. Then, etching is performed by using the resist film 55 as a mask, thereby selectively removing the polycrystalline silicon film 34, the gate oxide film 33, and the polycrystalline silicon film 32 in the memory cell region Rmemo. As a result, the control gate electrode 111 and the floating gate electrode 112 are formed in the memory cell region Rmemo.

The illustration of the subsequent process steps will be omitted herein. After the resist film 55 has been removed, an interlevel insulator film, contact holes and an interconnection layer are formed. As a result, a nonvolatile memory cell is formed in the memory cell region Rmemo, while a field effect transistor to be a driver circuit for the memory cell and a field effect transistor to be a logic circuit are formed in the peripheral circuit region Rperi.

In this embodiment, in the memory cell region Rmemo, the buried insulator film 102, constituting element isolations in a cross section perpendicular to the gate longitudinal direction, is formed to be self-aligned with the floating gate electrode 112, while the floating gate electrode 112 is formed to be self-aligned with the control gate electrode 111. Thus, in the same way as in the first embodiment, the density in the memory cell region Rmemo can be further increased.

In addition, since the top surface of the substrate is leveled in the process step (shown in FIG. 2e) immediately prior to the step of forming the trench isolations, fine trench isolations can be formed both in the memory cell region Rmemo and in the peripheral circuit region Rperi by performing a simple process of forming trench isolations only once. Furthermore, since element isolation is accomplished not by a LOCOS film but by the trench isolations both in the memory cell region Rmemo and in the peripheral circuit region Rperi, the density of the entire semiconductor device can be increased.

Also, in the process step (see FIG. 4c) of forming the control gate electrode 111 and the gate electrode 113, the memory cell region Rmemo and the peripheral circuit region Rperi are at a substantially equal level. Thus, the top surface of the control gate electrode 111 in the memory cell region Rmemo is leveled with the top surface of the gate electrode 113 in the peripheral circuit region Rperi. Accordingly, a metal interconnection pattern can be easily formed subsequently.

Consequently, the fabrication process of this embodiment also realizes single-chip implementation of dissimilar devices such as flash memory and DRAM/logic with practicable fabrication costs in the same way as in the first embodiment.

In particular, in the method for fabricating the semiconductor device of this embodiment, there is no need for providing a conductor-protecting film of silicon oxide or the like on the polycrystalline silicon film 34, which simplifies the fabrication process as compared with the first embodiment.

In this embodiment, the gate electrode 113 is formed beforehand in the peripheral circuit region Rperi and then the control gate electrode 111 and the floating gate electrode 112 are formed in the memory cell region Rmemo. Alternatively, the gate electrode 113 may be formed in the peripheral circuit region Rperi after the control gate electrode 111 and the floating gate electrode 112 have been formed in the memory cell region Rmemo.

EMBODIMENT 3

Next, the third embodiment will be described with reference to FIGS. 5a to 5e. FIGS. 5a to 5e are cross-sectional views showing the fabrication process of the semiconductor device in the third embodiment. These cross-sectional views are all taken along the line 9A—9A shown in FIG. 9. More specifically, these cross-sectional views show a memory cell in the memory cell region Rmemo in the direction parallel to the gate longitudinal direction and a MOSFET in the peripheral circuit region Rperi in the direction perpendicular to the gate longitudinal direction.

In this embodiment, the process steps shown in FIGS. 2a to 2f are also performed as in the first embodiment. The description of these process steps will be omitted herein.

Figure 5A:
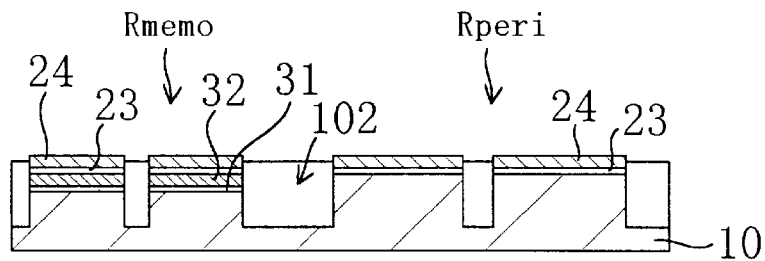
FIGS. 5a to 5e are cross-sectional views showing the process step of forming a buried insulator film and the subsequent process steps thereof for fabricating a semiconductor device in the third embodiment.

Subsequently to the process step shown in FIG. 2f, in the process step shown in FIG. 5a, a buried insulator film 102 is formed in trenches by depositing a silicon oxide film by the CVD method and leveling the surface by CMP.

Figure 5B:
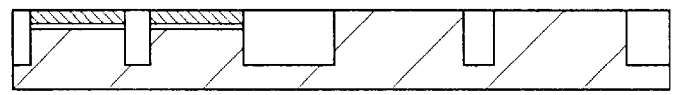

Next, in the process step shown in FIG. 5b, the silicon nitride film 24 and the pad oxide film 23 are removed. At this point in time, the surface of the polycrystalline silicon film 32 is exposed in the memory cell region Rmemo, while the surface of the semiconductor substrate 10 is exposed in the peripheral circuit region Rperi.

Figure 5C:
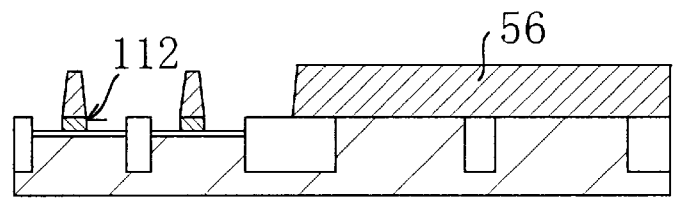

Thereafter, in the process step shown in FIG. 5c, a resist film 56, covering the entire peripheral circuit region Rperi and a region where a floating gate electrode is to be formed in the memory cell region Rmemo, is formed. Then, etching is performed by using the resist film 56 as a mask, thereby forming a floating gate electrode 112 in the memory cell region Rmemo.

Figure 5D:
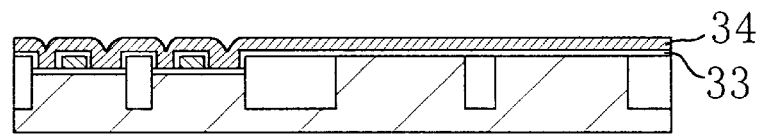

Next, in the process step shown in FIG. 5d, after the resist film 56 has been removed, a gate oxide film 33 having a thickness of about 10 nm and a polycrystalline silicon film 34 having a thickness of about 150 nm as the second conductor film are formed in this order over the entire surface of the substrate.

Figure 5E:
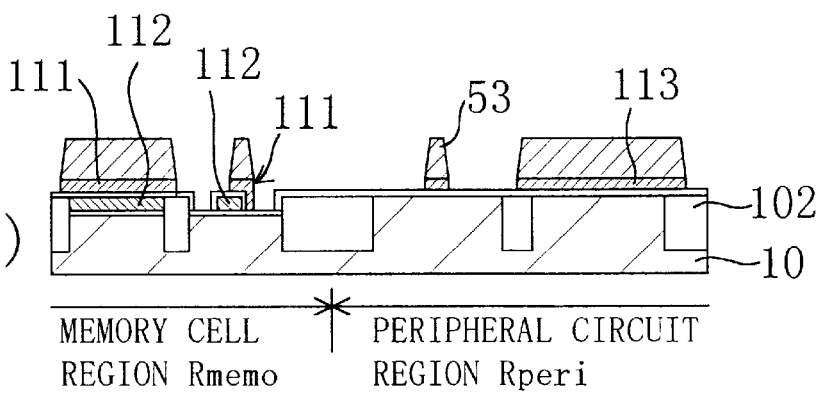

Then, in the process step shown in FIG. 5e, a resist film 53, covering a region where a control gate electrode is to be formed in the memory cell region Rmemo and a region where a gate electrode is to be formed in the peripheral circuit region Rperi, is formed. Thereafter, etching is performed by using the resist film 53 as a mask, thereby selectively removing the polycrystalline silicon film 34. As a result, a gate electrode 113 is formed in the peripheral circuit region Rperi, while a control gate electrode 111, mounted over the floating gate electrode 112 and the semiconductor substrate 10 via the gate oxide film 33, is formed in the memory cell region Rmemo.

The illustration of the subsequent process steps will be omitted herein. After the resist film 53 has been removed, an interlevel insulator film, contact holes and an interconnection layer are formed. As a result, a nonvolatile memory cell is formed in the memory cell region Rmemo, while a field effect transistor to be a driver circuit for the memory cell and a field effect transistor to be a logic circuit are formed in the peripheral circuit region Rperi.

In accordance with the fabrication process of this embodiment, the same effects as those attained by the first and second embodiments can also attained in a split-gate type memory cell having superior data retention characteristics to those of a stacked-gate type memory cell of the first and second embodiments.

Specifically, in the memory cell region Rmemo, the buried insulator film 102, constituting element isolations in a cross section perpendicular to the gate longitudinal direction, is formed to be self-aligned with the floating gate electrode 112. Thus, the density in the memory cell region Rmemo can be further increased.

In addition, since the top surface of the substrate is leveled in the process step (shown in FIG. 2e) immediately prior to the step of forming the trench isolations, fine trench isolations can be formed both in the memory cell region Rmemo and in the peripheral circuit region Rperi by performing a simple process of forming trench isolations only once in the same way as in the first embodiment. Furthermore, since element isolation is accomplished not by a LOCOS film but by the trench isolations both in the memory cell region Rmemo and in the peripheral circuit region Rperi, the density of the entire semiconductor device can be increased.

Also, in the process step (see FIG. 5b) of forming the floating gate electrode 112, the memory cell region Rmemo and the peripheral circuit region Rperi are at a substantially equal level. Thus, a subsequent photolithography process can be performed accurately and easily and a metal interconnection pattern can be easily formed.

Consequently, the fabrication process of this embodiment also realizes single-chip implementation of dissimilar devices such as flash memory and DRAM/logic with practicable fabrication costs in the same way as in the first and the second embodiments.

EMBODIMENT 4

Next, the fourth embodiment will be described with reference to FIG. 6, FIGS. 7a to 7g and FIGS. 8a to 8d. All of these are cross-sectional views taken along the line 9A—9A shown in FIG. 9. More specifically, these cross-sectional views show a memory cell in the memory cell region Rmemo in the direction parallel to the gate longitudinal direction and a MOSFET in the peripheral circuit region Rperi in the direction perpendicular to the gate longitudinal direction.

Figure 6:
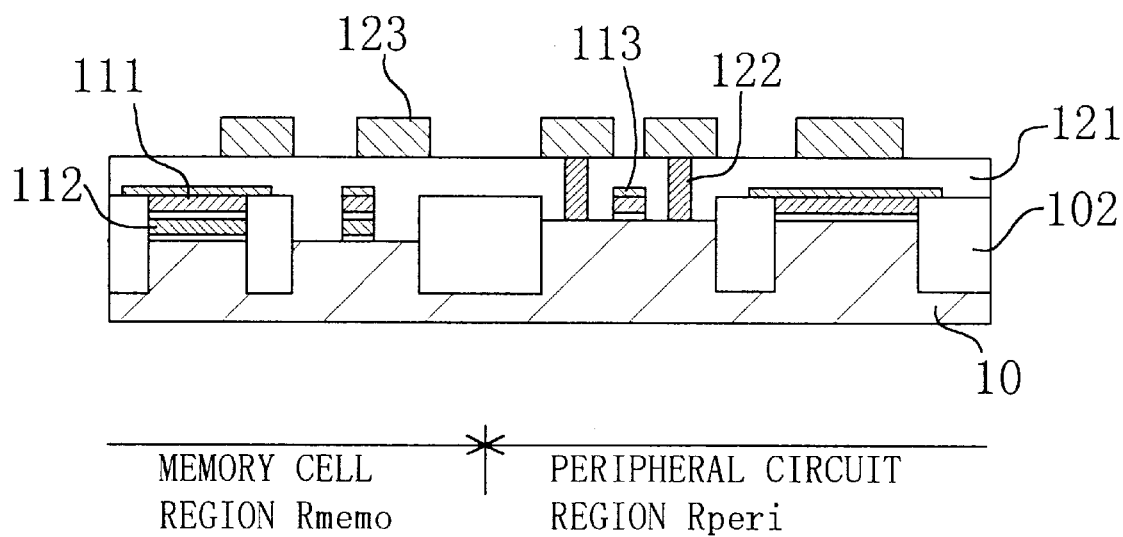
FIG. 6 is a cross-sectional view showing a structure of a semiconductor device in the fourth and the fifth embodiments.

FIG. 6 is a cross-sectional view of the semiconductor device in the fourth and the fifth embodiments. As shown in FIG. 6, the semiconductor device includes: a semiconductor substrate 10; a control gate electrode 111 in the memory cell region Rmemo; a floating gate electrode 112; a gate electrode 113 in the peripheral circuit region Rperi; a buried insulator film 102 for element isolation; an interlevel insulator film 121; contact holes 122; and metal interconnections 123. The semiconductor device of this embodiment is characterized in that each of the control gate electrode 111 in the memory cell region Rmemo and the gate electrode 113 in the peripheral circuit region Rperi is formed of a two-layered polycrystalline silicon film, unlike the semiconductor device in the first to the third embodiments.

FIGS. 7a to 7g and FIGS. 8a to 8d are cross-sectional views showing the fabrication process of the semiconductor device in this embodiment.

Figure 7A:
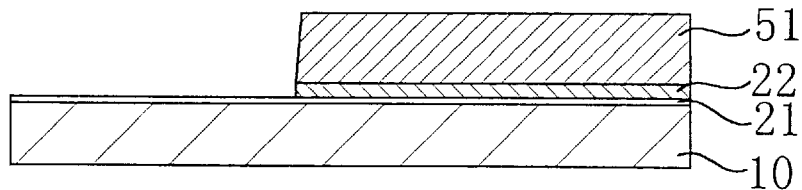
FIGS. 7a to 7g are cross-sectional views showing the respective process steps, performed until element-isolating trenches are formed, for fabricating a semiconductor device in the fourth embodiment.

First, in the process step shown in FIG. 7a, a pad oxide film 21 having a thickness of about 10 nm is formed by oxidizing the surface of the semiconductor substrate 10 and then a silicon nitride film 22 having a thickness of about 150 nm is deposited thereon. Then, a resist film 51 having openings over the memory cell region Rmemo is further formed thereon, and etching is performed by using the resist film 51 as a mask, thereby removing the silicon nitride film 22 in the memory cell region.

Figure 7B:
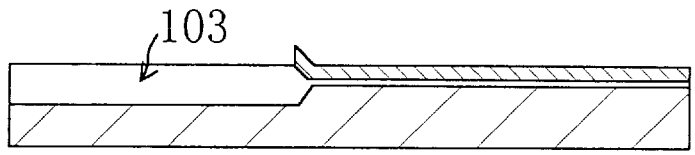

Next, in the process step shown in FIG. 7b, after the resist film 51 has been removed, the entire surface of the substrate is oxidized such that the pad oxide film 21, the surface of which is exposed in the memory cell region Rmemo, is thickened in the memory cell region Rmemo, thereby forming a field oxide film 103.

Figure 7C:
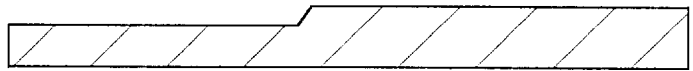

Then, in the process step shown in FIG. 7c, the silicon nitride film 22, the pad oxide film 21 and the field oxide film 103, which have been formed on the semiconductor substrate 10, are all removed.

Figure 7D:
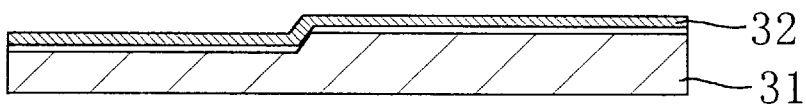

Subsequently, in the process step shown in FIG. 7d, a tunnel oxide film 31 having a thickness of about 10 nm is formed by oxidizing the entire surface of the semiconductor substrate 10, and then a polycrystalline silicon film 32 having a thickness of about 100 nm is deposited thereon as a first conductor film.

Figure 7E:

Thereafter, in the process step shown in FIG. 7e, a part of the polycrystalline silicon film 32 in the peripheral circuit region Rperi is removed by performing CMP using the tunnel oxide film 31 as a stopper, thereby leveling the entire surface of the substrate. At this point in time, the polycrystalline silicon film 32 is exposed in the memory cell region Rmemo, while the tunnel oxide film 31 is exposed in the peripheral circuit region Rperi. Thereafter, only the tunnel oxide film 31 exposed in the peripheral circuit region Rperi is removed by selective etching.

Figure 7F:
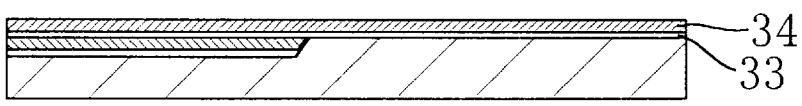

Next, in the process step shown in FIG. 7f, a gate oxide film 33 having a thickness of about 10 nm and a polycrystalline silicon film 34 having a thickness of about 150 nm as a second conductor film are formed in this order over the entire surface of the substrate.

Figure 7G:
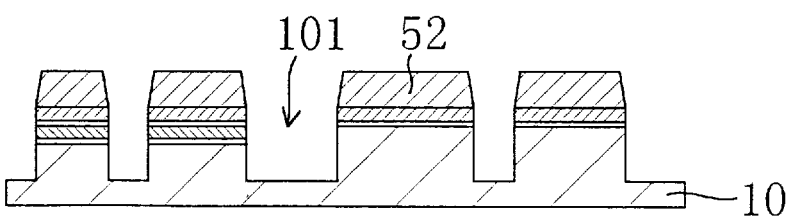

Subsequently, in the process step shown in FIG. 7g, a resist film 52, having openings over the regions where the element isolations are to be provided, is formed. Then, etching is performed by using the resist film 52 as a mask, thereby sequentially removing the polycrystalline silicon film 34, the gate oxide film 33, the polycrystalline silicon film 32, the tunnel oxide film 31 and the substrate 10. Element-isolating trenches 101 are formed in this manner.

Figure 8A:
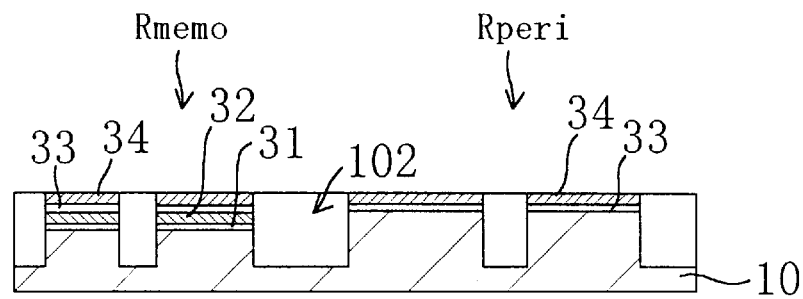
FIGS. 8a to 8d are cross-sectional views showing the process step of forming a buried insulator film and the subsequent process steps thereof for fabricating a semiconductor device in the fourth embodiment.

Then, in the process step shown in FIG. 8a, a buried insulator film 102 is formed in the element-isolating trenches 101 by depositing a silicon oxide film by the CVD method and leveling the surface by CMP using the polycrystalline silicon film 34 as a stopper.

Figure 8B:
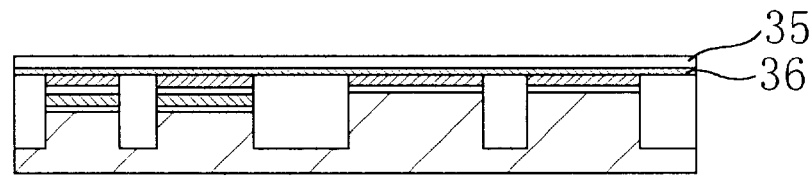

Next, in the process step shown in FIG. 8b, a polycrystalline silicon film 36 having a thickness of about 50 nm and a silicon oxide film 35 having a thickness of about 150 nm are sequentially formed as a third conductor film and as a conductor-protecting film, respectively, over the entire surface of the substrate.

Figure 8C:
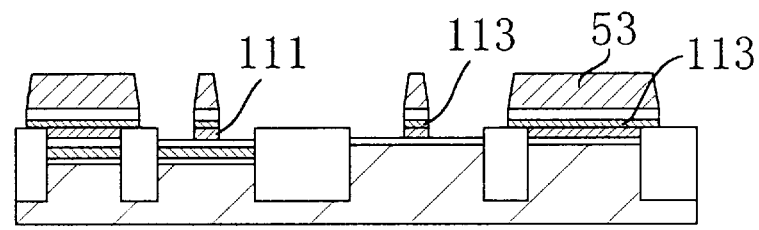

Then, in the process step shown in FIG 8c, a resist film 53, covering a region where a control gate electrode is to be formed in the memory cell region Rmemo and a region where a gate electrode is to be formed in the peripheral circuit region Rperi, is formed. Thereafter, etching is performed by using the resist film 53 as a mask, thereby selectively removing the silicon oxide film 35 and the polycrystalline silicon films 36 and 34. As a result, a control gate electrode 111 and a gate electrode 113 are formed in the memory cell region Rmemo and in the peripheral circuit region Rperi, respectively.

Subsequently, in the process step shown in FIG. 8d, after the resist film 53 has been removed, a resist film 51 having an opening over the memory cell region Rmemo and covering the peripheral circuit region Rperi, is formed. Then, etching is performed by using, as a mask, the resist film 51, the control gate electrode 111 and the silicon oxide film 35, thereby selectively removing the gate oxide film 33 and the polycrystalline silicon film 32 in the memory cell region Rmemo. As a result, a floating gate electrode 112 is formed in the memory cell region Rmemo.

The illustration of the subsequent process steps will be omitted herein. After the resist film 51 has been removed, an interlevel insulator film, contact holes and an interconnection layer are formed. As a result, a nonvolatile memory cell is formed in the memory cell region Rmemo, while a field effect transistor to be a driver circuit for the memory cell and a field effect transistor to be a logic circuit are formed in the peripheral circuit region Rperi.

In this embodiment, in the memory cell region Rmemo, the buried insulator film 102, constituting element isolations in a cross section perpendicular to the gate longitudinal direction, is formed to be self-aligned with the floating gate electrode 112 and the floating gate electrode 112 is formed to be self-aligned with the control gate electrode 111. Thus, the density in the memory cell region Rmemo can be increased in the same way as in the first to the third embodiments.

In addition, since the top surface of the substrate is leveled in the process step (shown in FIG. 7f) immediately prior to the step of forming the trench isolations, fine trench isolations can be formed both in the memory cell region Rmemo and in the peripheral circuit region Rperi by performing a simple process of forming trench isolations only once in the same way as in the first to the third embodiments. Furthermore, since element isolation is accomplished not by a LOCOS film but by the trench isolations both in the memory cell region Rmemo and in the peripheral circuit region Rperi, the density of the entire semiconductor device can be increased.

Also, in the process step (see FIG. 8b) of forming the control gate electrode 111 and the gate electrode 113, the memory cell region Rmemo and the peripheral circuit region Rperi are at a substantially equal level. Thus, the upper surface of the control gate electrode 111 in the memory cell region Rmemo is substantially leveled with the gate electrode 113 in the peripheral circuit region Rperi. Accordingly, a metal interconnection pattern can be easily formed subsequently.

Consequently, the fabrication process of this embodiment also realizes single-chip implementation of dissimilar devices such as flash memory and DRAM/logic with practicable fabrication costs in the same way as in the first embodiment.

Figure 8D:
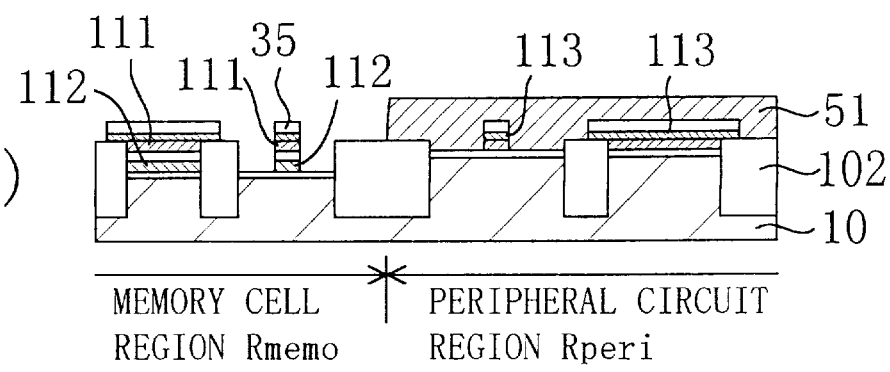

In particular, in the method for fabricating the semiconductor device of this embodiment, the gate electrode 113 in the peripheral circuit region Rperi is formed of a two-layered polycrystalline silicon film and the element isolations are formed to be self-aligned with the underlying layer 34 of the gate electrode 113 (see the right end of FIG. 8d). Thus, it is possible to suppress the variations in characteristics resulting from the high electric field on the sides of the trenches, which has adversely been caused in conventional trench isolations.

EMBODIMENT 5

Next, the fifth embodiment will be described with reference to FIGS. 10a to 10d. FIGS. 10a to 10d are cross-sectional views showing the fabrication process of the semiconductor device in the fifth embodiment. These cross-sectional views are all taken along the line 9A—9A shown in FIG. 9. More specifically, these cross-sectional views show a memory cell in the memory cell region Rmemo in the direction parallel to the gate longitudinal direction and a MOSFET in the peripheral circuit region Rperi in the direction perpendicular to the gate longitudinal direction.

In this embodiment, the process steps shown in FIGS. 7a to 7g are also performed as described in the fourth embodiment. Thus, the description of these process steps will be omitted herein.

Figure 10A:
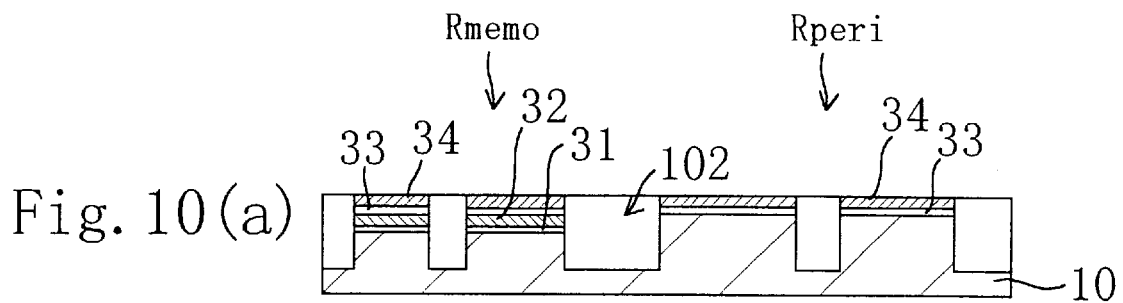
FIGS. 10a to 10d are cross-sectional views showing the process step of forming a buried insulator film and the subsequent process steps thereof for fabricating a semiconductor device in the fifth embodiment.

Subsequently to the process step shown in FIG. 7g, in the process step shown in FIG. 10a, a buried insulator film 102 is formed in the element-isolating trenches 101 by depositing a silicon oxide film by the CVD method and leveling the surface by CMP using the polycrystalline silicon film 34 as a stopper.

Figure 10B:
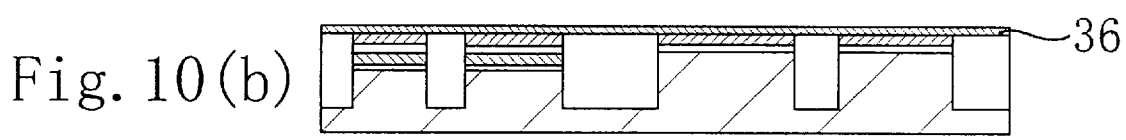

Next, in the process step shown in FIG. 10b, a polycrystalline silicon film 36 having a thickness of about 50 nm is formed as the third conductor film over the entire surface of the substrate.

Figure 10C:
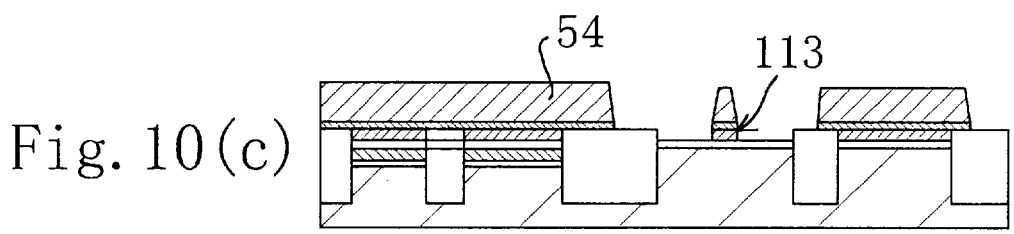

Then, in the process step shown in FIG. 10c, a resist film 54, covering the entire memory cell region Rmemo and a region where a gate electrode is to be formed in the peripheral circuit region Rperi, is formed. Thereafter, etching is performed by using the resist film 54 as a mask, thereby selectively removing the polycrystalline silicon films 36 and 34. As a result, a gate electrode 113 is formed in the peripheral circuit region Rperi.

Subsequently, in the process step shown in FIG. 10d, after the resist film 54 has been removed, a resist film 55, covering a region where a control gate electrode is to be formed in the memory cell region Rmemo and the entire peripheral circuit region Rperi, is formed. Then, etching is performed by using the resist film 55 as a mask, thereby selectively removing the polycrystalline silicon films 36 and 34, the gate oxide film 33 and the polycrystalline silicon film 32 in the memory cell region Rmemo. As a result, a control gate electrode 111 and a floating gate electrode 112 are formed in the memory cell region Rmemo.

The illustration of the subsequent process steps will be omitted herein. After the resist film 55 has been removed, an interlevel insulator film, contact holes and an interconnection layer are formed. As a result, a nonvolatile memory cell is formed in the memory cell region Rmemo, while a field effect transistor to be a driver circuit for the memory cell and a field effect transistor to be a logic circuit are formed in the peripheral circuit region Rperi.

In this embodiment, in the memory cell region Rmemo, the buried insulator film 102, constituting element isolations in a cross section perpendicular to the gate longitudinal direction, is formed to be self-aligned with the floating gate electrode 112 and the floating gate electrode 112 is formed to be self-aligned with the control gate electrode 111. Thus, the density in the memory cell region Rmemo can be increased in the same way as in the first to the third embodiments.

In addition, since the top surface of the substrate is leveled in the process step (shown in FIG. 7f) immediately prior to the step of forming the trench isolations, fine trench isolations can be formed both in the memory cell region Rmemo and in the peripheral circuit region Rperi by performing a simple process of forming trench isolations only once in the same way as in the first to the third embodiments. Furthermore, since element isolation is accomplished not by a LOCOS film but by the trench isolations both in the memory cell region Rmemo and in the peripheral circuit region Rperi, the density of the entire semiconductor device can be increased.

Also, in the process step (see FIG. 10b) of forming the control gate electrode 111 and the gate electrode 113, the memory cell region Rmemo and the peripheral circuit region Rperi are at a substantially equal level in the same way as in the fourth embodiment. Thus, the upper surface of the control gate electrode 111 in the memory cell region Rmemo is substantially leveled with the gate electrode 113 in the peripheral circuit region Rperi. Accordingly, a metal interconnection pattern can be easily formed subsequently.

Consequently, the fabrication process of this embodiment also realizes single-chip implementation of dissimilar devices such as flash memory and DRAM/logic with practicable fabrication costs in the same way as in the fourth embodiment.

Figure 10D:
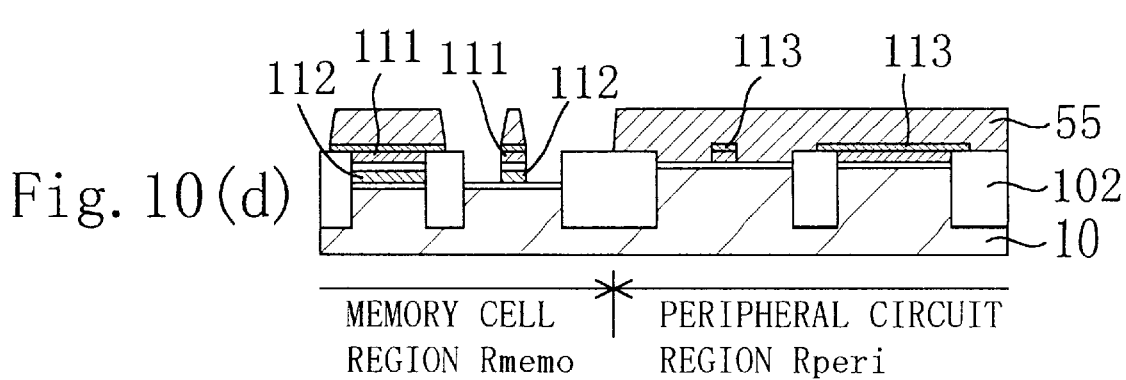

In the same way as in the fourth embodiment, the gate electrode 113 in the peripheral circuit region Rperi is formed of a two-layered polycrystalline silicon film and the element isolations are formed to be self-aligned with the underlying layer 34 of the gate electrode 113 (see the right end of FIG. 10d). Thus, it is possible to suppress the variations in characteristics resulting from the high electric field on the sides of the trenches, which has adversely been caused in conventional trench isolations.

In particular, in the method for fabricating the semiconductor device of this embodiment, there is no need for providing a conductor-protecting film of silicon oxide or the like on the polycrystalline silicon film 36, which simplifies the fabrication process.

In this embodiment, the gate electrode 113 is formed beforehand in the peripheral circuit region Rperi and then the control gate electrode 111 and the floating gate electrode 112 are formed in the memory cell region Rmemo. Alternatively, the gate electrode 113 may be formed in the peripheral circuit region Rperi after the control gate electrode 111 and the floating gate electrode 112 have been formed in the memory cell region Rmemo.

EMBODIMENT 6

Next, a method for fabricating a semiconductor device of the sixth embodiment will be described with reference to FIGS. 11a to 11f. FIGS. 11a to 11f are cross-sectional views showing the fabrication process of the semiconductor device in the sixth embodiment. These cross-sectional views are all taken along the line 9A—9A shown in FIG. 9. More specifically, these cross-sectional views show a memory cell in the memory cell region Rmemo in the direction parallel to the gate longitudinal direction and a MOSFET in the peripheral circuit region Rperi in the direction perpendicular to the gate longitudinal direction.

In this embodiment, the process steps shown in FIGS. 7a to 7g are also performed as described in the fourth embodiment. Thus, the description of these process steps will be omitted herein.

Figure 11A:
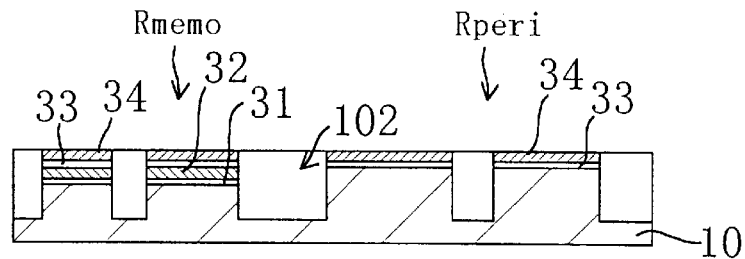
FIGS. 11a to 11f are cross-sectional views showing the process step of forming a buried insulator film and the subsequent process steps thereof for fabricating a semiconductor device in the sixth embodiment.

Subsequently to the process step shown in FIG. 7g, in the process step shown in FIG. 11a, a buried insulator film 102 is formed in the element-isolating trenches 101 by depositing a silicon oxide film by the CVD method and leveling the surface by CMP using the polycrystalline silicon film 34 as a stopper.

Figure 11B:
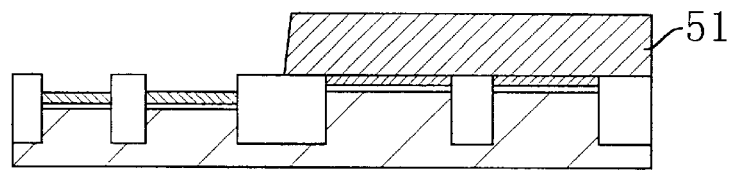

Next, in the process step shown in FIG. 11b, a resist film 51, having an opening over the memory cell region Rmemo, is formed, and etching is performed by using the resist film 51 as a mask, thereby selectively removing the polycrystalline silicon film 34 and the first gate oxide film 33 in the memory cell region Rmemo.

Figure 11C:
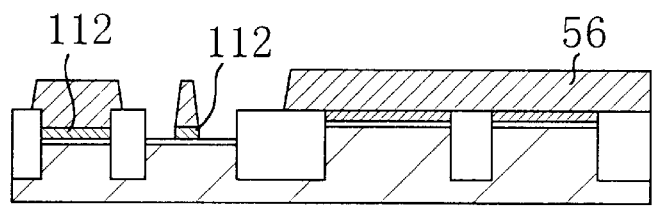

Then, in the process step shown in FIG. 11c, a resist film 56, covering the entire peripheral circuit region Rperi and a region where a floating gate electrode is to be formed in the memory cell region Rmemo, is formed. Thereafter, etching is performed by using the resist film 56 as a mask, thereby selectively removing the polycrystalline silicon film 32 in the memory cell region Rmemo. A floating gate electrode 112 is formed in this manner in the memory cell region Rmemo.

Figure 11D:
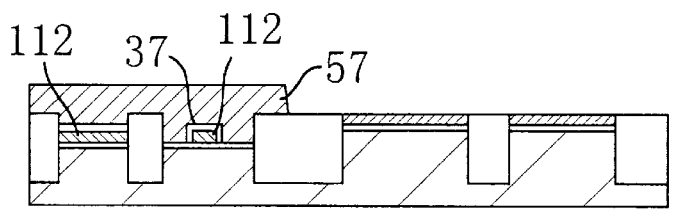

Next, in the process step shown in FIG. 11d, after the resist film 56 has been removed, a second gate oxide film 37 having a thickness of about 10 nm is formed over the entire surface of the substrate, and a resist film 57, having an opening over the peripheral circuit region Rperi, is formed thereon. Then, etching is performed by using the resist film 57 as a mask, thereby removing the second gate oxide film 37 in the peripheral circuit region Rperi.

Figure 11E:
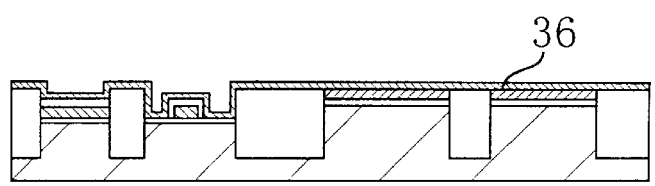

Subsequently, in the process step shown in FIG. 11e, after the resist film 57 has been removed, a polycrystalline silicon film 36 having a thickness of about 50 nm is deposited as a third conductor film over the entire surface of the substrate.

Figure 11F:
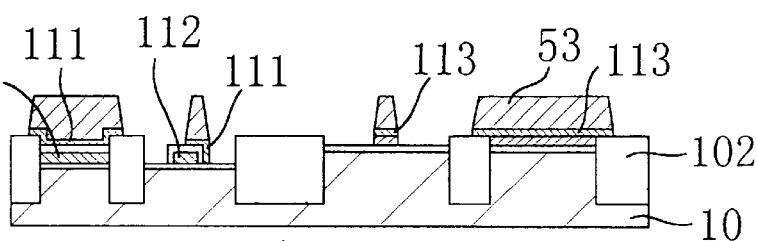

Then, in the process step shown in FIG. 11f, a resist film 53, covering a region where a control gate electrode is to be formed in the memory cell region Rmemo and a region where a gate electrode is to be formed in the peripheral circuit region Rperi, is formed. Thereafter, etching is performed by using the resist film 53 as a mask, thereby selectively removing the polycrystalline silicon films 36 and 34. As a result, a control gate electrode 111 and a gate electrode 113 are formed in the memory cell region Rmemo and in the peripheral circuit region Rperi, respectively.

The illustration of the subsequent process steps will be omitted herein. After the resist film 53 has been removed, an interlevel insulator film, contact holes and an interconnection layer are formed. As a result, a nonvolatile memory cell is formed in the memory cell region Rmemo, while a field effect transistor to be a driver circuit for the memory cell and a field effect transistor to be a logic circuit are formed in the peripheral circuit region Rperi.

In this embodiment, the same effects as those attained by the fourth and the fifth embodiments can also attained in a split-gate type memory cell having superior data retention characteristics to those of a stacked-gate type memory cell of the fourth and the fifth embodiments.

Specifically, in the memory cell region Rmemo, the buried insulator film 102, constituting element isolations in a cross section perpendicular to the gate longitudinal direction, is formed to be self-aligned with the floating gate electrode 112 and the floating gate electrode 112 is formed to be self-aligned with the control gate electrode 111. Thus, the density in the memory cell region Rmemo can be further increased.

In addition, since the top surface of the substrate is leveled in the process step (shown in FIG. 7f) immediately prior to the step of forming the trench isolations, fine trench isolations can be formed both in the memory cell region Rmemo and in the peripheral circuit region Rperi by performing a simple process of forming trench isolations only once. Furthermore, since element isolation is accomplished not by a LOCOS film but by the trench isolations both in the memory cell region Rmemo and in the peripheral circuit region Rperi, the density of the entire semiconductor device can be increased.

Also, in the process step (see FIG. 11a) of forming the control gate electrode 111 and the gate electrode 113, the memory cell region Rmemo and the peripheral circuit region Rperi are at a substantially equal level. Thus, the upper surface of the control gate electrode 111 in the memory cell region Rmemo is substantially leveled with the upper surface of the gate electrode 113 in the peripheral circuit region Rperi. Accordingly, a metal interconnection pattern can be easily formed subsequently.

Consequently, the fabrication process of this embodiment also realizes single-chip implementation of dissimilar devices such as flash memory and DRAM/logic with practicable fabrication costs in the same way as in the fourth and the fifth embodiments.

In the same way as in the fourth and the fifth embodiments, the gate electrode 113 in the peripheral circuit region Rperi is formed of a two-layered polycrystalline silicon film and the element isolations are formed to be self-aligned with the underlying layer 34 of the gate electrode 113 (see the right end of FIG. 11f). Thus, it is possible to suppress the variations in characteristics resulting from the high electric field on the sides of the trenches, which has adversely been caused in conventional trench isolations.

EMBODIMENT 7

Figure 12A:
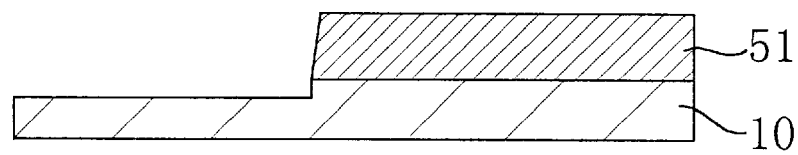
FIGS. 12a to 12c are cross-sectional views showing the respective process steps, performed until leveling is performed, for fabricating a semiconductor device in the seventh embodiment.
Figure 12B:
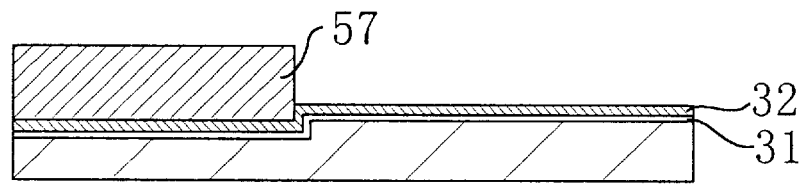
Figure 12C:
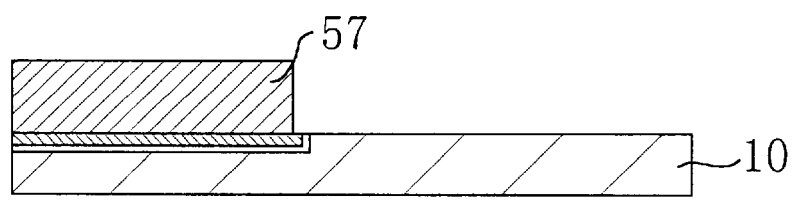

Next, a method for fabricating a semiconductor device of the seventh embodiment will be described with reference to FIGS. 12a to 12c. FIGS. 12a to 12c are cross-sectional views showing the process steps, until leveling is performed, in the fabrication process of the semiconductor device in the seventh embodiment.

First, in the process step shown in FIG. 12a, a resist film 51, having an opening over the memory cell region Rmemo and covering the peripheral circuit region Rperi, is formed on the semiconductor substrate 10. Then, etching is performed by using the resist film 51 as a mask, thereby selectively removing the semiconductor substrate 10 in the memory cell region Rmemo to reach a depth of about 100 nm.

Next, in the process step shown in FIG. 12b, after the resist film 51 has been removed, a tunnel oxide film 31 having a thickness of about 10 nm is formed by oxidizing the entire surface of the semiconductor substrate 10, and then a polycrystalline silicon film 32 having a thickness of about 100 nm is deposited thereon as a first conductor film. Furthermore, a resist film 57, covering the memory cell region Rmemo and having an opening over the peripheral circuit region Rperi, is formed thereon.

Subsequently, in the process step shown in FIG. 12c, etching is performed by using the resist film 57 as a mask, thereby removing the polycrystalline silicon film 32 and the tunnel oxide film 31 in the peripheral circuit region Rperi.

The illustration of the subsequent process steps will be omitted herein. After the resist film 57 has been removed, a nonvolatile memory cell including the floating gate electrode and the control gate electrode is formed in the memory cell region Rmemo, while a field effect transistor including the gate electrode is formed in the peripheral circuit region Rperi by performing similar process steps to the counterparts of the first to the sixth embodiments. For example, the process steps shown in FIGS. 2f and FIGS. 3a to 3e in the first embodiment or the process steps shown in FIGS. 7f, 7g and FIGS. 8a to 8d in the fourth embodiment are performed.

In this embodiment, in the process step shown in FIG. 12c, the polycrystalline silicon film 32, constituting a floating gate electrode, is formed in the memory cell region Rmemo, and the top surface of the polycrystalline silicon film 32 in the memory cell region Rmemo is substantially leveled with the top surface of the semiconductor substrate 10 in the peripheral circuit region Rperi. Consequently, the element density can be increased both in the memory cell region Rmemo and in the peripheral circuit region Rperi by performing a simplified process step as compared with the fabrication processes of the semiconductor device in the first to the sixth embodiments.

In particular, in this embodiment, the process step of forming a such level difference that the top surface of the semiconductor substrate in the memory cell region Rmemo is set lower than the top surface of the semiconductor substrate in the peripheral circuit region Rperi in view of the thickness of the floating gate electrode and that of the tunnel oxide film is performed by etching, not by a LOCOS technique. As a result, the fabrication process can be simplified. Furthermore, variations in thickness of the first conductor film because of dishing occurring during CMP can be reduced by performing the process step of leveling the top surface of the polycrystalline silicon film 32 as the first conductor film in the memory cell region Rmemo with the top surface of the semiconductor substrate in the peripheral circuit region Rperi by means of etching.

EMBODIMENT 8

Next, a method for fabricating a semiconductor device in the eighth embodiment will be described with reference to FIGS. 13a to 13e. FIGS. 13a to 13e are cross-sectional views showing the process steps, until leveling is performed, in the fabrication process of the semiconductor device in the eighth embodiment.

Figure 13A:
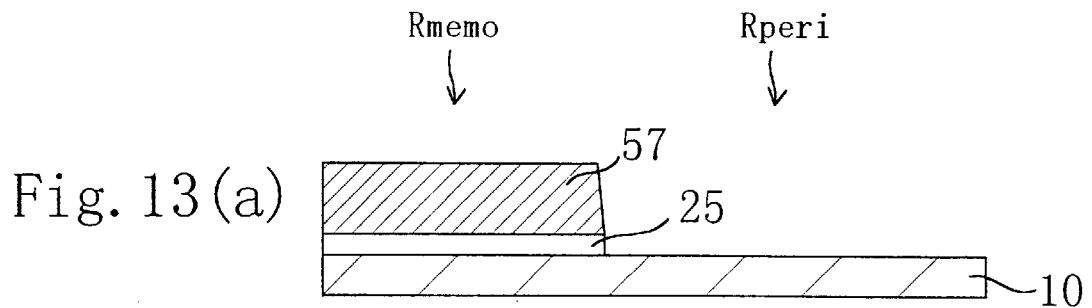
FIGS. 13a to 13e are cross-sectional views showing the respective process steps, performed until leveling is performed, for fabricating a semiconductor device in the eighth embodiment.

First, in the process step shown in FIG. 13a, a silicon oxide film 25 having a thickness of about 100 nm is formed by oxidizing the entire surface of the semiconductor substrate 10, and a resist film 57, covering the memory cell region Rmemo and having an opening over the peripheral circuit region Rperi, is formed thereon. Then, etching is performed by using the resist film 57 as a mask, thereby removing the silicon oxide film 25 in the peripheral circuit region Rperi.

Figure 13B:

Next, in the process step shown in FIG. 13b, after the resist film 57 has been removed, a single crystalline silicon film 11 having a thickness of about 100 nm is grown by selective epitaxy over a region where the surface of the semiconductor substrate 10 has been exposed in the peripheral circuit region Rperi. In other words, the top surface of the silicon oxide film 25 in the memory cell region Rmemo is substantially leveled with the top surface of the single crystalline silicon film 11 in the peripheral circuit region Rperi.

Figure 13C:
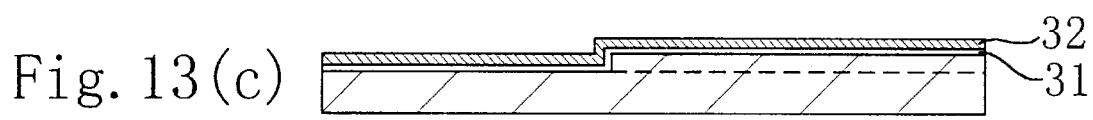

Subsequently, in the process step shown in FIG. 13c, after the silicon oxide film 25 in the memory cell region Rmemo has been removed, a tunnel oxide film 31 having a thickness of about 10 nm is formed by oxidizing the entire surface of the semiconductor substrate 10, and then a polycrystalline silicon film 32 having a thickness of about 100 nm is deposited thereon as a first conductor film.

Figure 13D:
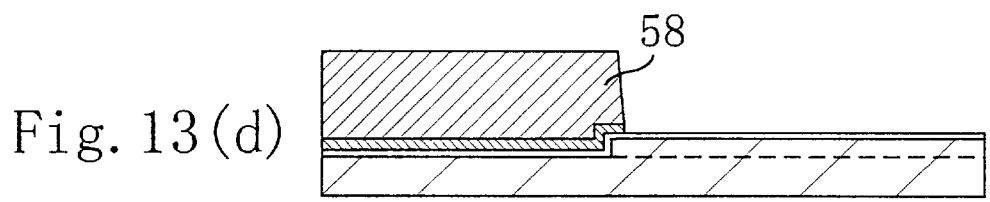

Next, in the process step shown in FIG. 13d, a resist film 58, covering the entire memory cell region Rmemo and a part of the peripheral circuit region Rperi reaching so far as about 1 μm from the boundary between the memory cell region Rmemo and the peripheral circuit region Rperi and having an opening over the remaining region of the peripheral circuit region Rperi, is formed. Then, etching is performed by using the resist film 58 as a mask, thereby removing the polycrystalline silicon film 32 in the peripheral circuit region Rperi.

Subsequently, in the process step shown in FIG. 13e, after the resist film 58 has been removed, a part of the polycrystalline silicon film 32 protruding on the boundary between the memory cell region Rmemo and the peripheral circuit region Rperi is removed by CMP, and the tunnel oxide film 31 in the peripheral circuit region Rperi is also removed, thereby leveling the entire surface of the substrate.

The illustration of the subsequent process steps will be omitted herein. A nonvolatile memory cell including the floating gate electrode and the control gate electrode is formed in the memory cell region Rmemo, while a field effect transistor including the gate electrode is formed in the peripheral circuit region Rperi by performing similar process steps to the counterparts of the first to the sixth embodiments. For example, the process steps shown in FIGS. 2f and FIGS. 3a to 3e in the first embodiment or the process steps shown in FIGS. 7f, 7g and FIGS. 8a to 8d in the fourth embodiment are performed.

Figure 13E:
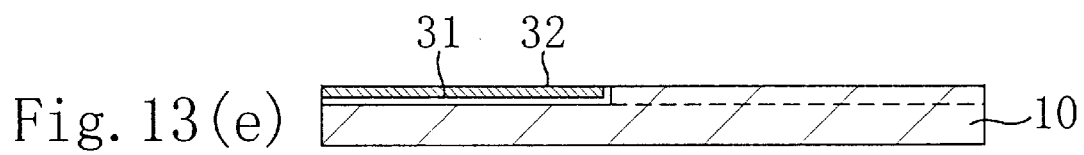

In this embodiment, in the process step shown in FIG. 13e, the polycrystalline silicon film 32, constituting a floating gate electrode, is formed in the memory cell region Rmemo, and the top surface of the polycrystalline silicon film 32 is substantially leveled with the top surface of the semiconductor substrate 10 in the peripheral circuit region Rperi. Consequently, the element density can be increased both in the memory cell region Rmemo and in the peripheral circuit region Rperi by performing a simplified process step as compared with the fabrication processes of the semiconductor device in the first to the sixth embodiments.

In particular, in this embodiment, the process step of forming a such level difference that the top surface of the semiconductor substrate in the memory cell region Rmemo is set lower than the top surface of the semiconductor substrate in the peripheral circuit region Rperi is performed by selective epitaxy. As a result, the breakdown voltages of the tunnel oxide film and the gate oxide film can be increased. Furthermore, variations in thickness of the first conductor film because of dishing occurring during CMP can be reduced by performing the process step of leveling the top surface of the polycrystalline silicon film 32 as the first conductor film in the memory cell region Rmemo with the top surface of the semiconductor substrate in the peripheral circuit region Rperi by means of etching and CMP in combination. Moreover, it is no longer necessary to take a mask misalignment, ordinarily resulting from a non-flat substrate surface, into consideration.

EMBODIMENT 9

Next, a method for fabricating a semiconductor device of the ninth embodiment will be described with reference to FIGS. 14a to 14e. FIGS. 14a to 14e are cross-sectional views showing the process steps, until leveling is performed, in the fabrication process of the semiconductor device in the ninth embodiment.

Figure 14A:
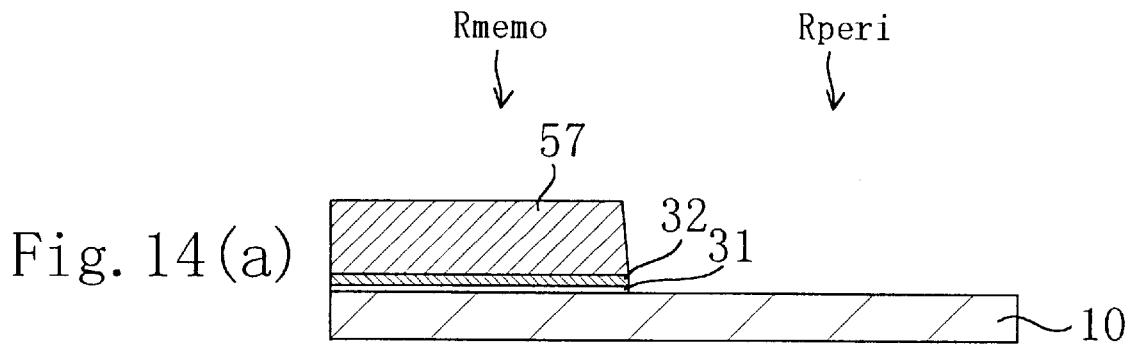
FIGS. 14a to 14d are cross-sectional views showing the respective process steps, performed until leveling is performed, for fabricating a semiconductor device in the ninth embodiment.

First, in the process step shown in FIG. 14a, a tunnel oxide film 31 having a thickness of about 10 nm is formed by oxidizing the entire surface of the semiconductor substrate 10, and a polycrystalline silicon film 32 having a thickness of about 100 nm is formed thereon as a first conductor film. Then, a resist film 57, covering the memory cell region Rmemo and having an opening over the peripheral circuit region Rperi, is formed. Thereafter, etching is performed by using the resist film 57 as a mask, thereby removing the polycrystalline silicon film 32 and the tunnel oxide film 31 in the peripheral circuit region Rperi.

Figure 14B:
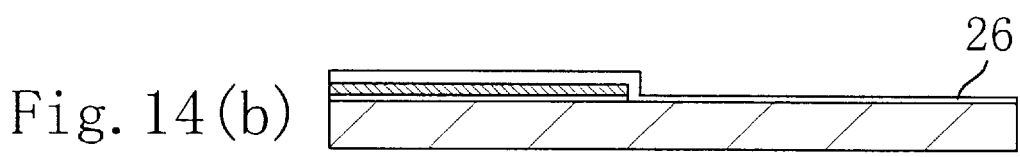

Next, in the process step shown in FIG. 14b, after the resist film 57 has been removed, a silicon oxide film 26 having a thickness of about 30 nm is formed as a conductor-protecting film by oxidizing the entire surface of the substrate. In this case, since accelerated oxidation phenomenon is generated, polycrystalline silicon is oxidized at a higher rate than single crystalline silicon. Thus, if the silicon oxide film 26 having a thickness of about 30 nm is formed on the polycrystalline silicon film 32, then a silicon oxide film 26 having a thickness of about 10 nm is formed on the substrate in the peripheral circuit region Rperi. The degree of the accelerated oxidation partly depends on an oxidation temperature and an oxidation atmosphere. Thus, the oxidation is preferably performed at a relatively low temperature (850° C. or below) and with a high vapor concentration.

Figure 14C:
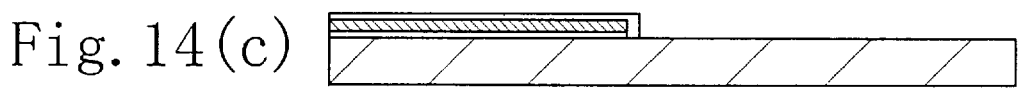

Then, in the process step shown in FIG. 14c, the silicon oxide film 26 on the substrate is partially removed by anisotropic etching. The amount of etching is set at about 15 nm so that the silicon oxide film 26 on the polycrystalline silicon film 32 in the memory cell region Rmemo may not be totally removed but is partially left to have a thickness of about 15 nm.

Figure 14D:
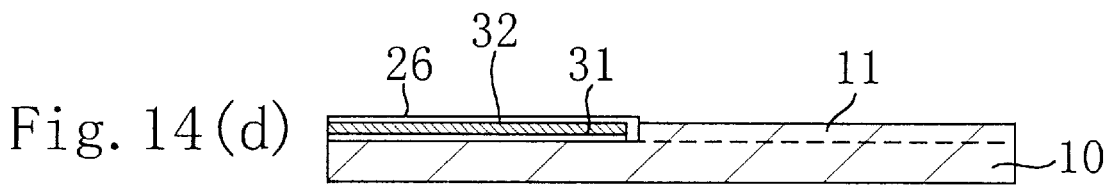

Then, in the process step shown in FIG. 14d, a single crystalline silicon film 11 having a thickness of about 100 nm is grown by selective epitaxy on an exposed area of the surface of the semiconductor substrate 10 in the peripheral circuit region Rperi. Thereafter, although not illustrated, the silicon oxide film 26 in the memory cell region Rmemo is removed and the entire surface of the substrate is substantially leveled.

The illustration of the subsequent process steps will be omitted herein. A nonvolatile memory cell including the floating gate electrode and the control gate electrode is formed in the memory cell region Rmemo, while a field effect transistor including the gate electrode is formed in the peripheral circuit region Rperi by performing similar process steps to the counterparts of the first to the sixth embodiments. For example, the process steps shown in FIGS. 2f and FIGS. 3a to 3e in the first embodiment or the process steps shown in FIGS. 7f, 7g and FIGS. 8a to 8d in the fourth embodiment are performed.

In this embodiment, in the process step shown in FIG. 14e, the polycrystalline silicon film 32, constituting a floating gate electrode, is formed in the memory cell region Rmemo, and the top surface of the polycrystalline silicon film 32 is substantially leveled with the top surface of the semiconductor substrate 10 in the peripheral circuit region Rperi by removing the silicon oxide film 26 subsequently. Thus, the element density can be increased both in the memory cell region Rmemo and in the peripheral circuit region Rperi by performing a simplified process step as compared with the fabrication processes of the semiconductor device in the first to the sixth embodiments.

In addition, in this embodiment, the process step of forming a such level difference that the top surface of the substrate in the memory cell region Rmemo is set lower than the top surface of the substrate in the peripheral circuit region Rperi and the process step of substantially leveling the top surface of the polycrystalline silicon film 32 as the first conductor film in the memory cell region Rmemo with the top surface of the substrate in the peripheral circuit region Rperi can be performed without forming any mask. As a result, the number of process steps can be reduced considerably.

EMBODIMENT 10

Next, a method for fabricating a semiconductor device of the tenth embodiment will be described with reference to FIGS. 15a to 15e. FIGS. 15a to 15e are cross-sectional views showing the fabrication process of the semiconductor device in the tenth embodiment.

Figure 15A:
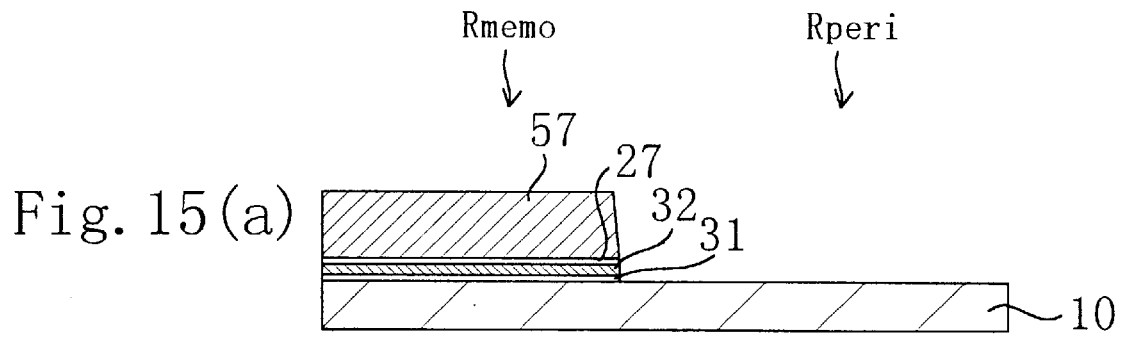
FIGS. 15a to 15d are cross-sectional views showing the respective process steps, performed until leveling is performed, for fabricating a semiconductor device in the tenth embodiment.

First, in the process step shown in FIG. 15a, a tunnel oxide film 31 having a thickness of about 10 nm is formed by oxidizing the entire surface of the semiconductor substrate 10. Then, a polycrystalline silicon film 32 having a thickness of about 100 nm and a silicon oxide film 27 having a thickness of about 50 nm are sequentially formed thereon as a first conductor film and as a first conductor-protecting film, respectively. After a resist film 57, covering the memory cell region Rmemo and having an opening over the peripheral circuit region Rperi, has been formed on the silicon oxide film 27, etching is performed by using the resist film 57 as a mask, thereby removing the silicon oxide film 27, the polycrystalline silicon film 32 and the tunnel oxide film 31 in the peripheral circuit region Rperi.

Figure 15B:
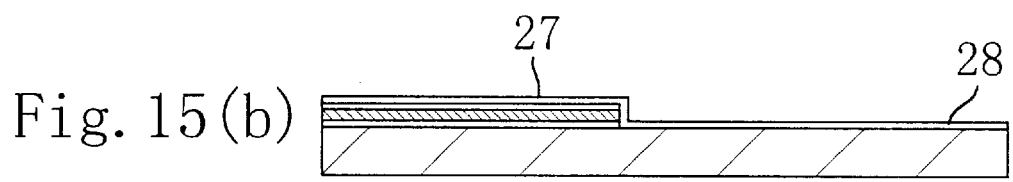

Then, in the process step shown in FIG. 15b, after the resist film 57 has been removed, a silicon oxide film 28 having a thickness of about 20 nm is formed as a second conductive protective film by oxidizing the entire surface of the substrate. In this case, the silicon oxide film 28 may be formed by either a CVD method or an oxidation method.

Figure 15C:
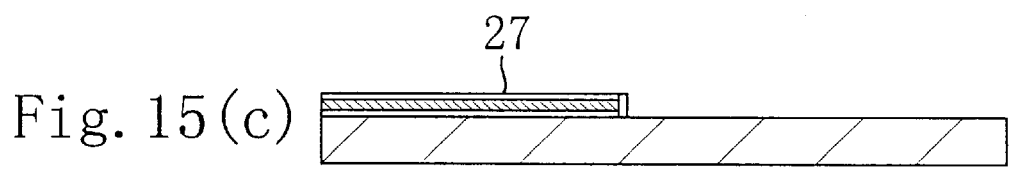

Subsequently, in the process step shown in FIG. 15c, the silicon oxide film 28 on the substrate is removed by anisotropic etching. Even if the silicon oxide film 28 formed as the second conductor-protecting film on the polycrystalline silicon film 32 in the memory cell region Rmemo is entirely removed, the silicon oxide film 27 has been previously formed as the first conductor-protecting film on the polycrystalline silicon film 32. Thus, the polycrystalline silicon film 32 in the memory cell region Rmemo cannot be etched.

Figure 15D:
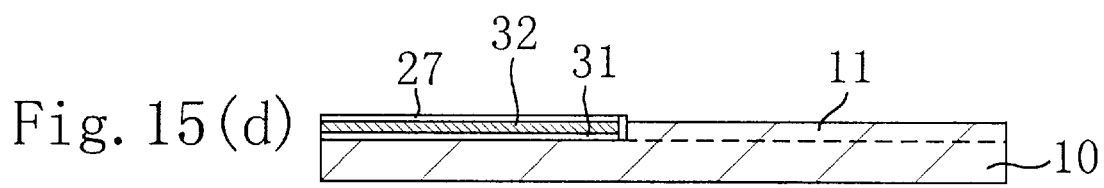

Next, in the process step shown in FIG. 15d, a single crystalline silicon film 11 having a thickness of about 100 nm is grown by selective epitaxy on an exposed area of the surface of the semiconductor substrate 10 in the peripheral circuit region Rperi. Thereafter, though not illustrated, the silicon oxide film 27 in the memory cell region Rmemo is removed and the entire surface of the substrate is substantially leveled.

The illustration of the subsequent process steps will be omitted herein. A nonvolatile memory cell including the floating gate electrode and the control gate electrode is formed in the memory cell region Rmemo, while a field effect transistor including the gate electrode is formed in the peripheral circuit region Rperi by performing similar process steps to the counterparts of the first to the sixth embodiments. For example, the process steps shown in FIGS. 2f and FIGS. 3a to 3e in the first embodiment or the process steps shown in FIGS. 7f, 7g and FIGS. 8a to 8d in the fourth embodiment are performed.

In this embodiment, in the process step shown in FIG. 15e, the polycrystalline silicon film 32, constituting a floating gate electrode, is formed in the memory cell region Rmemo, and the top surface of the polycrystalline silicon film 32 is substantially leveled with the top surface of the semiconductor substrate 10 in the peripheral circuit region Rperi by removing the silicon oxide film 27 subsequently. Thus, the element density can be increased both in the memory cell region Rmemo and in the peripheral circuit region Rperi by performing a simplified process step as compared with the fabrication processes of the semiconductor device in the first to the sixth embodiments.

In addition, in this embodiment, the process step of forming a such level difference that the top surface of the substrate in the memory cell region Rmemo is set lower than the top surface of the substrate in the peripheral circuit region Rperi and the process step of substantially leveling the top surface of the polycrystalline silicon film 32 as the first conductor film in the memory cell region Rmemo with the top surface of the substrate in the peripheral circuit region Rperi can be performed without forming any mask. As a result, the number of process steps can be reduced considerably.

Furthermore, in this embodiment, a process margin during etching of the silicon oxide film 28 as the second conductor-protecting film can be increased, thereby increasing the yield.

EMBODIMENT 11

Figure 16A:
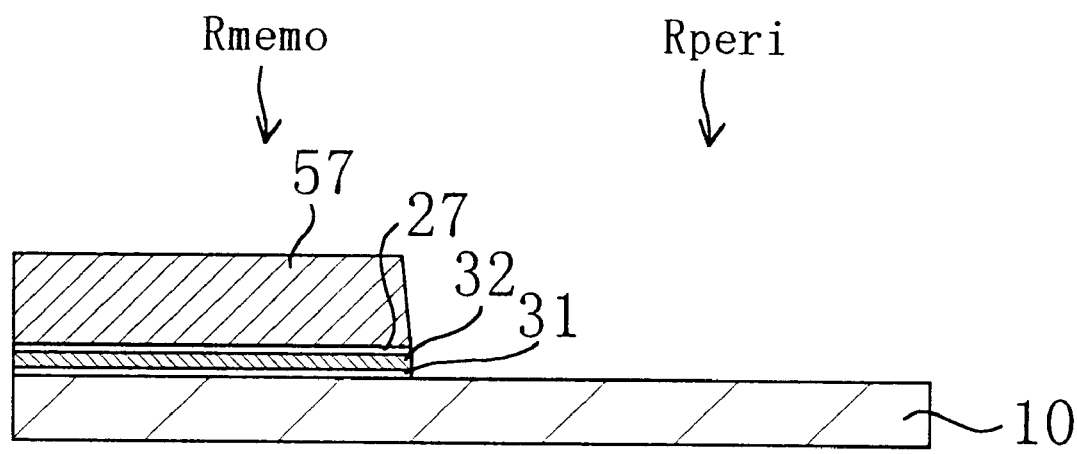
FIGS. 16a and 16b are cross-sectional views showing the respective process steps, performed until leveling is performed, for fabricating a semiconductor device in the eleventh embodiment.
Figure 16B:
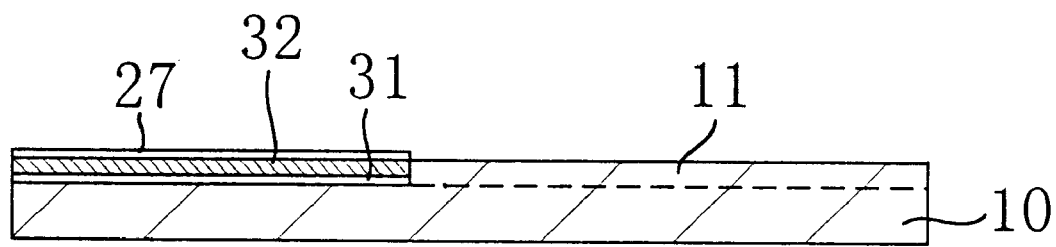
Figure 17:
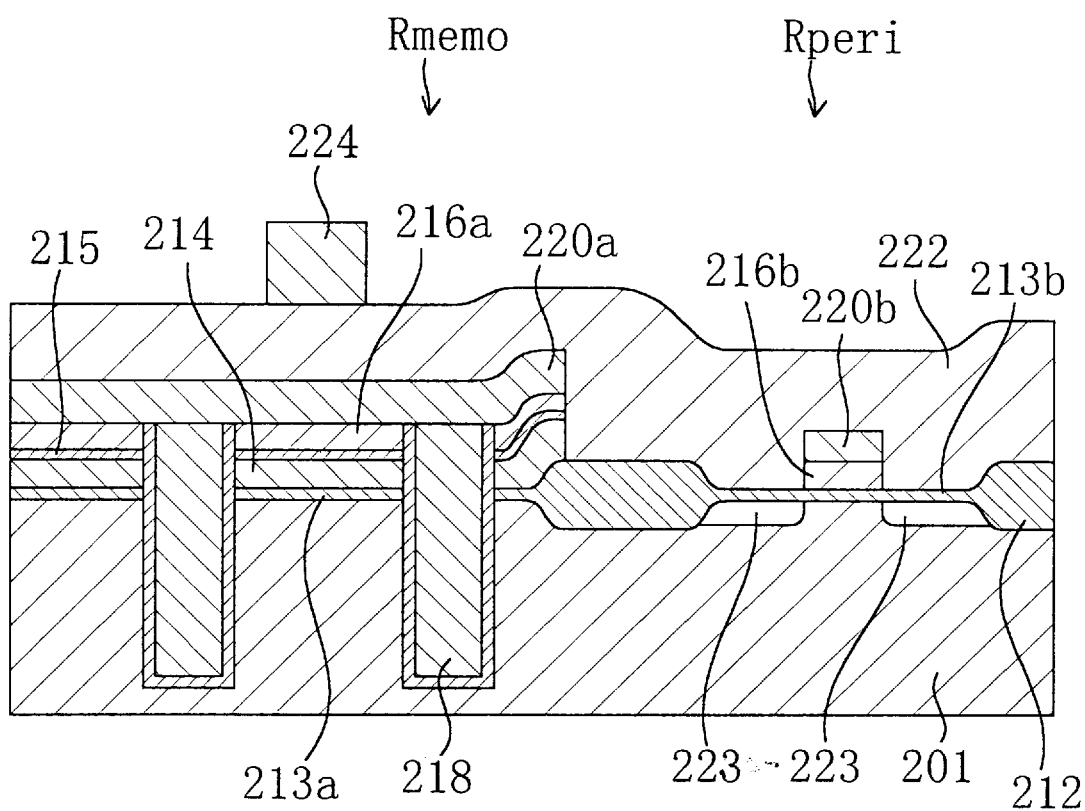
FIG. 17 is a cross-sectional view showing a structure of a conventional semiconductor device.

Next, a method for fabricating a semiconductor device of the eleventh embodiment will be described with reference to FIGS. 16a and 16b. FIGS. 16a and 16b are cross-sectional views showing the fabrication process of the semiconductor device in the eleventh embodiment.

First, in the process step shown in FIG. 16a, a tunnel oxide film 31 having a thickness of about 10 nm is formed by oxidizing the entire surface of the semiconductor substrate 10. Then, a polycrystalline silicon film 32 having a thickness of about 100 nm and a silicon oxide film 27 having a thickness of about 50 nm are sequentially formed thereon as a first conductor film and a conductor-protecting film, respectively. After a resist film 57, covering the memory cell region Rmemo and having an opening over the peripheral circuit region Rperi, has been formed on the silicon oxide film 27, etching is performed by using the resist film 57 as a mask, thereby removing the silicon oxide film 27, the polycrystalline silicon film 32 and the tunnel oxide film 31 in the peripheral circuit region Rperi.

Next, in the process step shown in FIG. 16b, a single crystalline silicon film 11 having a thickness of about 100 nm is grown by selective epitaxy on an exposed area of the surface of the semiconductor substrate 10 in the peripheral circuit region Rperi. Thereafter, the silicon oxide film 27 in the memory cell region Rmemo is removed and the entire surface of the substrate is substantially leveled, though not illustrated.

The illustration of the subsequent process steps will be omitted herein. A nonvolatile memory cell including the floating gate electrode and the control gate electrode is formed in the memory cell region Rmemo, while a field effect transistor including the gate electrode is formed in the peripheral circuit region Rperi by performing similar process steps to the counterparts of the first to the sixth embodiments. For example, the process steps shown in FIGS. 2f and FIGS. 3a to 3e in the first embodiment or the process steps shown in FIGS. 7f, 7g and FIGS. 8a to 8d in the fourth embodiment are performed.

In this embodiment, in the process step shown in FIG. 16b, the polycrystalline silicon film 32, constituting a floating gate electrode, is formed in the memory cell region Rmemo, and the top surface of the polycrystalline silicon film 32 is substantially leveled with the top surface of the semiconductor substrate 10 in the peripheral circuit region Rperi by removing the silicon oxide film 27 subsequently. Thus, the element density can be increased both in the memory cell region Rmemo and in the peripheral circuit region Rperi by performing a simplified process step as compared with the fabrication processes of the semiconductor device in the first to the sixth embodiments.

In addition, in this embodiment, the process step of forming a such level difference that the top surface of the substrate in the memory cell region Rmemo is set lower than the top surface of the substrate in the peripheral circuit region Rperi and the process step of substantially leveling the top surface of the polycrystalline silicon film 32 as the first conductor film in the memory cell region Rmemo with the top surface of the substrate in the peripheral circuit region Rperi can be performed without forming any mask. As a result, the number of process steps can be considerably reduced.

In particular, this embodiment has an advantage that a single crystalline silicon film 11 can be formed by a simplified process as compared with the ninth and the tenth embodiments.

It is noted that the crystallinity of the single crystalline silicon film 11 is possibly deteriorated in the vicinity of the boundary between the memory cell region Rmemo and the peripheral circuit region Rperi, because the sides of the polycrystalline silicon film 32 are not protected with an insulator film. However, such regions having inferior crystallinity can be easily removed by forming element-isolating trenches in the vicinity of the boundary in the subsequent process step.

OTHER EMBODIMENTS

In the foregoing embodiments, source/drain regions for a nonvolatile memory cell and a field effect transistor and ion implantation and heat treatment for forming a well or controlling a threshold value have not been mentioned. Naturally, these processes may be carried out in accordance with known techniques.

In the foregoing embodiments, in the leveling step for forming the buried insulator film 102 in the element-isolating trenches 101, CMP is employed. Alternatively, a resist etch-back technique or a spin etching technique may also be employed. In such a case, if an etch selectivity is set at such a value as to allow a polycrystalline silicon film to function as an etching stopper, then the silicon nitride film 24 of the first to the third embodiments may be replaced by a polycrystalline silicon film.

The gate oxide film 33 of the first to the fifth embodiments functions as a gate insulator film for the field effect transistor in the peripheral circuit region Rperi and as a capacitive insulator film between the floating gate electrode and the control gate electrode in the memory cell region Rmemo, and has a common thickness in these two regions. However, the control gate electrode 111 in the memory cell region Rmemo and the gate electrode 113 in the peripheral circuit region Rperi are subjected to respectively different conditions such as a applied voltage. Thus, these electrodes may be formed to have different thicknesses. In that case, the following process steps may be performed.

First, in the process step shown in FIG. 3c and the like, after the gate oxide film 33 (a first gate insulator film) has been deposited by an oxidation method or a CVD method, a resist film covering the memory cell region Rmemo is formed. Then, the gate oxide film 33 in the peripheral circuit region Rperi is either thickened or entirely removed. Subsequently, a second gate insulator film is deposited over the entire surface by an oxidation method or a CVD method and a polycrystalline silicon film 34 is deposited as a second conductor film. By performing such a process step, a gate insulator film having an uneven thickness in the memory cell region Rmemo and in the peripheral circuit region Rperi can be formed. However, in the process step shown in FIG. 3c and the like, if the gate oxide film 33 is formed by an oxidation method, the gate oxide film 33 in the memory cell region Rmemo generally becomes much thicker than the gate oxide film 33 in the peripheral circuit region Rperi because polycrystalline silicon is oxidized at a higher rate than single crystalline silicon because of the above-mentioned accelerated oxidation phenomenon. Thus, the gate oxide film in the memory cell region Rmemo can be thicker than the gate oxide film in the peripheral circuit region Rperi without performing the above-mentioned process step.

Furthermore, the thicker gate insulator film may be used not only in the memory cell region Rmemo but also in the peripheral circuit region Rperi for a field effect transistor having a high breakdown voltage or an input/output transistor.

In the first to the sixth embodiments, a polycrystalline silicon film is used as a conductor film. However, in the first to the third embodiments, the second conductor film may be a multi-layer film including a polycrystalline silicon film (or an amorphous silicon film) and a metallic film (or a metallic compound film). In the fourth to the sixth embodiments, the third conductor film may be a single-layer film made of a metal or a metallic compound or a multi-layer film including a polycrystalline silicon film (or an amorphous silicon film) and a metallic film (or a metallic compound film).

What is claimed is:

1. A semiconductor device comprising:
    a semiconductor substrate, including a memory cell region and a peripheral circuit region;
    trench isolations, formed so as to respectively surround a first active region in the memory cell region and a second active region in the peripheral circuit region of the semiconductor substrate;
    a nonvolatile memory cell, disposed in the memory cell region and formed by sequentially stacking a tunnel insulator film, a floating gate electrode, a gate insulator film and a control gate electrode at least in the first active region on the semiconductor substrate; and
    a field effect transistor, disposed in the peripheral circuit region and formed by sequentially stacking a gate insulator film and a gate electrode at least in the second active region on the semiconductor substrate,
    wherein a top surface of the semiconductor substrate in the second active region is at a level that is higher than a top surface of the semiconductor substrate in the first active region and that is substantially equal to a top surface of the floating gate electrode.

2. The semiconductor device of claim 1, wherein a top surface of the trench isolations is at a level substantially equal to the top surface of the semiconductor substrate in the second active region in the peripheral circuit region and the top surface of the floating gate electrode.

3. The semiconductor device of claim 2, wherein the floating gate electrode of the nonvolatile memory cell is disposed between the trench isolations and self-aligned with the trench isolations in a vertical cross section perpendicular to a gate longitudinal direction.

4. The semiconductor device of claim 1, wherein the control gate electrode of the nonvolatile memory cell is formed so as to be mounted over the floating gate electrode and the semiconductor substrate.

5. The semiconductor device of claim 1, wherein each of the control gate electrode and the gate electrode is formed of one of the group consisting of: a polycrystalline silicon film; an amorphous silicon film; a metallic film; a multi-layer film of a polycrystalline silicon film and a metallic film; a multi-layer film of a polycrystalline silicon film and a metallic compound film; a multi-layer film of an amorphous silicon film and a metallic film; a multi-layer film of an amorphous silicon film and a metallic compound film; a multi-layer film of metallic films; a multi-layer film of metallic films and a polycrystalline silicon film; and a multi-layer film of metallic films and an amorphous silicon film.

6. The semiconductor device of claim 1, wherein the control gate electrode of the nonvolatile memory cell and the gate electrode of the field effect transistor are formed of a common overlying conductor film and a common underlying conductor film,
    the underlying conductor film in the second active region in the peripheral circuit region is disposed between the trench isolations and self-aligned with the trench isolations in a vertical cross section perpendicular to a gate longitudinal direction of the field effect transistor, and
    a top surface of the trench isolations is at a level substantially equal to a top surface of the underlying conductor film.

7. The semiconductor device of claim 1, wherein the gate electrode of the field effect transistor is formed of an overlying conductor film and an underlying conductor film,
    the control gate electrode of the nonvolatile memory cell is formed of the overlying conductor film only and formed so as to be mounted over the floating gate electrode and the semiconductor substrate, and
    the underlying conductor film in the second active region in the peripheral circuit region is disposed between the trench isolations and self-aligned with the trench isolations in a vertical cross section perpendicular to a gate longitudinal direction of the field effect transistor.

8. The semiconductor device of claim 6, wherein the underlying conductor film is selected from the group consisting of: a polycrystalline silicon film; an amorphous silicon film; a metallic film; a multi-layer film of a polycrystalline silicon film and a metallic film; a multi-layer film of a polycrystalline silicon film and a metallic compound film; a multi-layer film of an amorphous silicon film and a metallic film; a multi-layer film of an amorphous silicon film and a metallic compound film; a multi-layer film of metallic films; a multi-layer film of metallic films and a polycrystalline silicon film; and a multi-layer film of metallic films and an amorphous silicon film.

9. The semiconductor device of claim 1, wherein the gate insulator film of the nonvolatile memory cell has a thickness larger than a thickness of the gate insulator film of the field effect transistor.

10. The semiconductor device of claim 1, wherein a region in the vicinity of a surface of the semiconductor substrate in the peripheral circuit region is formed of a semiconductor crystalline film formed by epitaxy.

11. A method for fabricating a semiconductor device, the semiconductor device including: a nonvolatile memory cell including a tunnel insulator film, a floating gate electrode, a gate insulator film and a control gate electrode on a first active region in a memory cell region of a semiconductor substrate; and a field effect transistor including a gate insulator film and a gate electrode on a second active region in a peripheral circuit region of the semiconductor substrate, the method comprising:

a first step of forming a level difference between a top surface of the semiconductor substrate in the memory cell region and a top surface of the semiconductor substrate in the peripheral circuit region such that the top surface of the semiconductor substrate in the memory cell region is at a level lower than the top surface of the semiconductor substrate in the peripheral circuit region;

a second step of sequentially forming the tunnel insulator film and a first conductor film on the top surface of the semiconductor substrate in the memory cell region and substantially leveling a top surface of the first conductor film with the top surface of the semiconductor substrate in the peripheral circuit region;

a third step of forming element-isolating trenches surrounding the first active region in the memory cell region and the second active region in the peripheral circuit region in the semiconductor substrate; and a fourth step of forming trench isolations by filling the trenches with the insulator film.

12. The method for fabricating a semiconductor device of claim 11, further comprising, after the fourth step has been performed, the steps of:

sequentially forming an insulator film for the gate insulator film, a second conductor film and a conductor-protecting film on the semiconductor substrate;

selectively removing the conductor-protecting film and the second conductor film by performing etching with a mask member covering a control gate electrode formation region and a gate electrode formation region, and forming the control gate electrode and an electrode protective film in the first active region and the gate electrode in the second active region, respectively; and removing the mask member and then selectively removing the insulator film for the gate insulator film and the first conductor film by performing etching by using, as an etching mask, a mask member covering the peripheral circuit region and the electrode protective film, thereby forming the floating gate electrode in the first active region.

13. The method for fabricating a semiconductor device of claim 11, further comprising, after the fourth step has been performed, the steps of:

sequentially forming an insulator film for the gate insulator film and a second conductor film on the semiconductor substrate;

selectively removing the second conductor film by performing etching with a mask member covering the memory cell region and a gate electrode formation region, and forming the gate electrode in the second active region; and removing the mask member and selectively removing the second conductor film, the insulator film for the gate insulator film and the first conductor film sequentially by performing etching by using a mask member covering the peripheral circuit region and a control gate electrode formation region, thereby forming the control gate electrode and the floating gate electrode in the first active region.

14. The method for fabricating a semiconductor device of claim 11, further comprising, after the fourth step has been performed, the steps of:

selectively removing the first conductor film by performing etching with a mask member covering the peripheral circuit region and a floating gate electrode formation region, and forming the floating gate electrode in the first active region;

removing the mask member and then sequentially forming an insulator film for the gate insulator film and a second conductor film on the semiconductor substrate; and selectively removing the first conductor film, the insulator film for the gate insulator film, and the second conductor film by performing etching by using a mask member covering a control gate electrode formation region and a gate electrode formation region, thereby forming the control gate electrode mounted over the floating gate electrode and the semiconductor substrate in the first active region and the gate electrode in the second active region, respectively.

15. The method for fabricating a semiconductor device of claim 11, wherein the insulator film for the gate insulator film is formed so as to have a larger thickness in the memory cell region than in the peripheral circuit region.

16. The method for fabricating a semiconductor device of claim 11, wherein the first step comprises the steps of:

sequentially forming a silicon oxide film and a silicon nitride film on the semiconductor substrate;

selectively removing the silicon nitride film in the memory cell region;

performing thermal oxidation by using the silicon nitride film as a mask and forming a LOCOS film on the semiconductor substrate in the memory cell region; and removing the silicon nitride film and the LOCOS film.

17. The method for fabricating a semiconductor device of claim 11, wherein the first step comprises the step of partially removing the semiconductor substrate in the memory cell region to reach a predetermined depth by performing etching with a mask member having an opening over the memory cell region.

18. The method for fabricating a semiconductor device of claim 11, wherein the first step comprises the steps of:

forming an insulator film on the semiconductor substrate;

selectively removing a part the insulator film, the part covering the peripheral circuit region;

epitaxially growing a semiconductor crystalline film on a surface of the semiconductor substrate which is exposed in the peripheral circuit region by using a remaining part of the insulator film as an epitaxy mask; and removing the remaining part of the insulator film.

19. The method for fabricating a semiconductor device of claim 11, wherein the second step comprises the steps of:

sequentially forming the tunnel insulator film and the first conductor film on the semiconductor substrate;

removing the first conductor film by CMP until at least a part of the tunnel insulator film in the peripheral circuit region is exposed; and removing the part of the tunnel insulator film in the peripheral circuit region by etching.

20. The method for fabricating a semiconductor device of claim 11, wherein the second step comprises the steps of:

sequentially forming the tunnel insulator film and the first conductor film on the semiconductor substrate; and selectively removing the first conductor film and the tunnel insulator film in the peripheral circuit region sequentially by performing etching with a mask member covering the memory cell region.

21. The method for fabricating a semiconductor device of claim 11, wherein the second step comprises the steps of:

sequentially forming the tunnel insulator film and the first conductor film on the semiconductor substrate;

selectively removing the first conductor film and the tunnel insulator film sequentially by performing etching with a mask member covering at least the memory cell region and a region of the peripheral circuit region, the region being in the vicinity of a boundary between the memory cell region and the peripheral circuit region;

removing the mask member and removing a residual part of the first conductor film by CMP, the residual part protruding in the vicinity of the boundary between the memory cell region and the peripheral circuit region; and removing the tunnel insulator film in the peripheral circuit region by etching.

22. A method for fabricating a semiconductor device, the semiconductor device including: a nonvolatile memory cell including a tunnel insulator film, a floating gate electrode, a gate insulator film and a control gate electrode on a first active region in a memory cell region of a semiconductor substrate; and a field effect transistor including a gate insulator film and a gate electrode on a second active region in a peripheral circuit region of the semiconductor substrate, the method comprising:

a first step of forming the tunnel insulator film, a first conductor film on the tunnel insulator film, and a conductor-protecting film on the first conductor film in the memory cell region with the semiconductor substrate in the peripheral circuit region exposed;

a second step of growing semiconductor crystals on the semiconductor substrate in the peripheral circuit region, thereby forming a semiconductor crystalline film having a top surface at a level substantially equal to a top surface of the first conductor film in the memory cell region;

a third step of removing the first conductor-protecting film on the first conductor film;

a fourth step of forming element-isolating trenches surrounding the first active region in the memory cell region and the second active region in the peripheral circuit region; and a fifth step of forming trench isolations by filling the trenches with the insulator film.

23. The method for fabricating a semiconductor device of claim 22, wherein the first step comprises the steps of:

sequentially forming the tunnel insulator film, the first conductor film, and the conductor-protecting film on the semiconductor substrate; and sequentially removing the conductor-protecting film, the first conductor film, and the tunnel insulator film in the peripheral circuit region by performing etching with a mask member covering the memory cell region.

24. The method for fabricating a semiconductor device of claim 22, wherein the first step comprises the steps of:

sequentially forming the tunnel insulator film and the first conductor film on the semiconductor substrate;

removing the first conductor film and the tunnel insulator film in the peripheral circuit region by performing etching with a mask member covering the memory cell region;

removing the mask member and then forming the first conductor-protecting film on the first conductor film in the memory cell region and on the semiconductor substrate in the peripheral circuit region so as to have a larger thickness on the first conductor film than on the semiconductor substrate; and removing the first conductor-protecting film in the peripheral circuit region by an etch-back technique under such a condition that the first conductor-protecting film on the first conductor film is residual in the memory cell region.

25. The method for fabricating a semiconductor device of claim 22, wherein the first step comprises the steps of:

sequentially forming the tunnel insulator film, the first conductor film, and the first conductor-protecting film on the semiconductor substrate;

removing the first conductor-protecting film, the first conductor film, and the tunnel insulator film in the peripheral circuit region by performing etching with a mask member covering the memory cell region;

removing the mask member and then forming a second conductor-protecting film on the semiconductor substrate; and selectively removing the second conductor-protecting film by an etch-back technique such that the second conductor-protecting film is residual on a side surface of the first conductor film and that the first conductor-protecting film is residual on the first conductor film.

26. The method for fabricating a semiconductor device of claim 22, further comprising, after the fifth step has been performed, the steps of:

forming an insulator film for the gate insulator film, a second conductor film and a protective film on the semiconductor substrate;

selectively removing the protective film and the second conductor film by performing etching with a mask member covering a control gate electrode formation region and a gate electrode formation region and forming the control gate electrode and an electrode protective film on the control gate electrode in the first active region and the gate electrode in the second active region, respectively; and removing the mask member and selectively removing the insulator film for the gate insulator film and the first conductor film by performing etching by using, as an etching mask, a mask member covering the peripheral circuit region and the electrode protective film, thereby forming the floating gate electrode in the first active region.

27. The method for fabricating a semiconductor device of claim 22, further comprising, after the fifth step has been performed, the steps of:

sequentially forming an insulator film for the gate insulator film and a second conductor film on the semiconductor substrate;

selectively removing the second conductor film by performing etching with a mask member covering the memory cell region and a gate electrode formation region and forming the gate electrode in the second active region; and removing the mask member and selectively removing the second conductor film, the insulator film for the gate insulator film and the first conductor film sequentially by performing etching with a mask member covering the peripheral circuit region and a control gate electrode formation region, thereby forming the control gate electrode and the floating gate electrode in the first active region.

28. The method for fabricating a semiconductor device of claim 22, further comprising, after the fifth step has been performed, the steps of:

selectively removing the first conductor film by performing etching with a mask member covering the peripheral circuit region and a floating gate electrode formation region and forming the floating gate electrode in the first active region;

removing the mask member and sequentially forming an insulator film for the gate insulator film and a second conductor film on the semiconductor substrate; and selectively removing the first conductor film, the insulator film for the gate insulator film and the second conductor film by performing etching with a mask member covering a control gate electrode formation region and a gate electrode formation region, thereby forming the control gate electrode mounted over the floating gate electrode and the semiconductor substrate in the first active region in the memory cell region and the gate electrode in the peripheral circuit region, respectively.

29. The method for fabricating a semiconductor device of claim 22, wherein the insulator film for the gate insulator film is formed so as to have a larger thickness in the memory cell region than in the peripheral circuit region.

30. A method for fabricating a semiconductor device, the semiconductor device including: a nonvolatile memory cell including a tunnel insulator film, a floating gate electrode, a gate insulator film and a control gate electrode at least on a first active region in a memory cell region of a semiconductor substrate; and a field effect transistor including a gate insulator film and a gate electrode at least on a second active region in a peripheral circuit region of the semiconductor substrate, the method comprising:

a first step of forming a level difference between a top surface of the semiconductor substrate in the memory cell region and a top surface of the semiconductor substrate in the peripheral circuit region such that the top surface of the semiconductor substrate in the memory cell region is at a level lower than the top surface of the semiconductor substrate in the peripheral circuit region;

a second step of sequentially forming the tunnel insulator film and a first conductor film on the top surface of the semiconductor substrate in the memory cell region and substantially leveling a top surface of the first conductor film with the top surface of the semiconductor substrate in the peripheral circuit region;

a third step of forming element-isolating trenches surrounding the first active region in the memory cell region and the second active region in the peripheral circuit region in the semiconductor substrate;

a fourth step of forming an insulator film for the gate insulator film and a second conductor film on the semiconductor substrate; and a fifth step of forming trench isolations by filling the trenches with the insulator film.

31. The method for fabricating a semiconductor device of claim 30, further comprising, after the fifth step has been performed, the steps of:

sequentially forming a third conductor film and a conductor-protecting film on the semiconductor substrate;

selectively removing the conductor-protecting film, the third conductor film and the second conductor film by performing etching with a mask member covering a control gate electrode formation region and a gate electrode formation region and forming the control gate electrode and an electrode protective film on the control gate electrode in the first active region and the gate electrode in the second active region, respectively; and removing the mask member and selectively removing the insulator film for the gate insulator film and the first conductor film by performing etching by using, as an etching mask, a mask member covering the peripheral circuit region and the electrode protective film, thereby forming the floating gate electrode in the first active region.

32. The method for fabricating a semiconductor device of claim 30, further comprising, after the fifth step has been performed, the steps of:

forming a third conductor film on the semiconductor substrate;

selectively removing the third conductor film and the second conductor film by performing etching with a mask member covering the memory cell region and a gate electrode formation region and forming the gate electrode in the second active region; and removing the mask member and selectively removing the third conductor film, the second conductor film, the insulator film for the gate insulator film and the first conductor film sequentially by performing etching by using a mask member covering the peripheral circuit region and a control gate electrode formation region, thereby forming the control gate electrode and the floating gate electrode in the first active region.

33. The method for fabricating a semiconductor device of claim 30, further comprising, to be performed after the fifth step, of:

removing the second conductor film and the insulator film for the gate insulator film in the memory cell region;

selectively removing the first conductor film by performing etching with a mask member covering the peripheral circuit region and a floating gate electrode formation region and forming the floating gate electrode in the first active region;

removing the mask member, selectively forming a second insulator film for the gate insulator film on the floating gate electrode over the first active region and forming a third conductor film on the semiconductor substrate; and selectively removing the second and the third conductor films by performing etching by using a mask member covering a control gate electrode formation region and a gate electrode formation region, thereby forming the control gate electrode mounted over the floating gate electrode and the semiconductor substrate in the first active region and the gate electrode in the second active region, respectively.

34. The method for fabricating a semiconductor device of claim 30, wherein the insulator film for the gate insulator film is formed so as to have a larger thickness in the memory cell region than in the peripheral circuit region.

35. The method for fabricating a semiconductor device of claim 30, wherein the first step comprises the steps of:
sequentially forming a silicon oxide film and a silicon nitride film on the semiconductor substrate;
selectively removing the silicon nitride film in the memory cell region;
performing thermal oxidation by using the silicon nitride film as a mask and forming a LOCOS film on the semiconductor substrate in the memory cell region; and
removing the silicon nitride film and the LOCOS film.

36. The method for fabricating a semiconductor device of claim 30, wherein the first step comprises the step of:
partially removing the semiconductor substrate in the memory cell region to reach a predetermined depth by performing etching with a mask member having an opening over the memory cell region.

37. The method for fabricating a semiconductor device of claim 30, wherein the first step comprises the steps of:
forming an insulator film on the semiconductor substrate;
selectively removing a part the insulator film, the part covering the peripheral circuit region;
epitaxially growing a semiconductor crystalline film on a surface of the semiconductor substrate which is exposed in the peripheral circuit region by using a remaining part of the insulator film as an epitaxy mask; and
removing the remaining part of the insulator film.

38. The method for fabricating a semiconductor device of claim 30, wherein the second step comprises the steps of:
sequentially forming the tunnel insulator film and the first conductor film on the semiconductor substrate;
removing the first conductor film by CMP until at least a part of the tunnel insulator film in the peripheral circuit region is exposed; and
removing the part of the tunnel insulator film in the peripheral circuit region by etching.

39. The method for fabricating a semiconductor device of claim 30, wherein the second step comprises the steps of:
sequentially forming the tunnel insulator film and the first conductor film on the semiconductor substrate; and
selectively removing the first conductor film and the tunnel insulator film in the peripheral circuit region sequentially by performing etching with a mask member covering the memory cell region.

40. The method for fabricating a semiconductor device of claim 30, wherein the second step comprises the steps of:
sequentially forming the tunnel insulator film and the first conductor film on the semiconductor substrate;
selectively removing the first conductor film and the tunnel insulator film sequentially by performing etching with a mask member covering at least the memory cell region and a region of the peripheral circuit region, the region being in the vicinity of a boundary between the memory cell region and the peripheral circuit region;
removing the mask member and removing a residual part of the first conductor film by CMP, the residual part protruding in the vicinity of the boundary between the memory cell region and the peripheral circuit region; and
removing the tunnel insulator film in the peripheral circuit region by etching.

41. A method for fabricating a semiconductor device, the semiconductor device including: a nonvolatile memory cell including a tunnel insulator film, a floating gate electrode, a gate insulator film and a control gate electrode on a first active region in a memory cell region of a semiconductor substrate; and a field effect transistor including a gate insulator film and a gate electrode on a second active region in a peripheral circuit region of the semiconductor substrate, the method comprising:
a first step of forming the tunnel insulator film, a first conductor film on the tunnel insulator film, and a conductor-protecting film on the first conductor film in the memory cell region with the semiconductor substrate in the peripheral circuit region exposed;
a second step of growing semiconductor crystals on the semiconductor substrate in the peripheral circuit region, thereby forming a semiconductor crystalline film having a top surface at a level substantially equal to a top surface of the first conductor film in the memory cell region;
a third step of removing the first conductor-protecting film on the first conductor film;
a fourth step of forming an insulator film for the gate insulator film and a second conductor film;
a fifth step of forming element-isolating trenches surrounding the first active region in the memory cell region and the second active region in the peripheral circuit region; and
a sixth step of forming trench isolations by filling the trenches with the insulator film.

42. The method for fabricating a semiconductor device of claim 41, wherein the first step comprises the steps of:
sequentially forming the tunnel insulator film, the first conductor film and the conductor-protecting film on the semiconductor substrate; and
sequentially removing the conductor-protecting film, the first conductor film and the tunnel insulator film in the peripheral circuit region by performing etching with a mask member covering the memory cell region.

43. The method for fabricating a semiconductor device of claim 42, wherein the first step comprises the steps of:
sequentially forming the tunnel insulator film and the first conductor film on the semiconductor substrate;
removing the first conductor film and the tunnel insulator film in the peripheral circuit region by performing etching with a mask member covering the memory cell region;
removing the mask member and forming the first conductor-protecting film on the first conductor film in the memory cell region and on the semiconductor substrate in the peripheral circuit region so as to have a larger thickness on the first conductor film than on the semiconductor substrate; and
removing the first conductor-protecting film in the peripheral circuit region by an etch-back technique under such a condition that the first conductor-protecting film on the first conductor film is residual in the memory cell region.

44. The method for fabricating a semiconductor device of claim 41, wherein the first step comprises the steps of:
sequentially forming the tunnel insulator film, the first conductor film and the first conductor-protecting film on the semiconductor substrate;
removing the first conductor-protecting film, the first conductor film and the tunnel insulator film in the peripheral circuit region by performing etching with a mask member covering the memory cell region;

removing the mask member and forming a second conductor-protecting film on the semiconductor substrate; and selectively removing the second conductor-protecting film by an etch-back technique such that the second conductor-protecting film is residual on a side surface of the first conductor film and that the first conductor-protecting film is residual on the first conductor film.

45. The method for fabricating a semiconductor device of claim 41, further comprising, after the sixth step has been performed, the steps of:

sequentially forming a third conductor film and a conductor-protecting film on the semiconductor substrate;

selectively removing the conductor-protecting film, the third conductor film and the second conductor film by performing etching with a mask member covering a control gate electrode formation region and a gate electrode formation region and forming the control gate electrode and an electrode protective film on the control gate electrode in the first active region and the gate electrode in the second active region, respectively; and removing the mask member and selectively removing the insulator film for the gate insulator film and the first conductor film by performing etching by using, as an etching mask, a mask member covering the peripheral circuit region and the electrode protective film, thereby forming the floating gate electrode in the first active region.

46. The method for fabricating a semiconductor device of claim 41, further comprising, after the sixth step has been performed, the steps of:

forming a third conductor film on the semiconductor substrate;

selectively removing the third conductor film and the second conductor film by performing etching with a mask member covering the memory cell region and a gate electrode formation region and forming the gate electrode in the second active region; and removing the mask member and selectively removing the third conductor film, the second conductor film, the insulator film for the gate insulator film and the first conductor film sequentially by performing etching with a mask member covering the peripheral circuit region and a control gate electrode formation region, thereby forming the control gate electrode and the floating gate electrode in the first active region.

47. The method for fabricating a semiconductor device of claim 41, further comprising, after the sixth step has been performed, the steps of:

removing the second conductor film and the insulator film for the gate insulator film in the memory cell region;

selectively removing the first conductor film by performing etching with a mask member covering the peripheral circuit region and a floating gate electrode formation region and forming the floating gate electrode in the first active region;

removing the mask member, selectively forming a second insulator film for the gate insulator film on the floating gate electrode over the first active region and forming a third conductor film on the semiconductor substrate; and selectively removing the second and the third conductor films by performing etching with a mask member covering a control gate electrode formation region and a gate electrode formation region, thereby forming the control gate electrode mounted over the floating gate electrode and the semiconductor substrate in the first active region and the gate electrode in the second active region, respectively.

48. The method for fabricating a semiconductor device of claim 41, wherein the insulator film for the gate insulator film is formed so as to have a larger thickness in the memory cell region than in the peripheral circuit region.

* * * * *